US012757404B2

(12) United States Patent
Lee et al.

(10) Patent No.: US 12,757,404 B2
(45) Date of Patent: Oct. 6, 2026

(54) HIGHLY INTEGRATED SEMICONDUCTOR DEVICE

(71) Applicant: Samsung Electronics Co., Ltd., Suwon-si (KR)

(72) Inventors: Kiheun Lee, Suwon-si (KR); Yongseok Kim, Suwon-si (KR); Hyuncheol Kim, Suwon-si (KR); Ilho Myeong, Suwon-si (KR); Daewon Ha, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 389 days.

(21) Appl. No.: 18/170,136

(22) Filed: Feb. 16, 2023

(65) Prior Publication Data

US 2024/0064996 A1 Feb. 22, 2024

(30) Foreign Application Priority Data

Aug. 19, 2022 (KR) ........................ 10-2022-0104011

(51) Int. Cl.

| | |
|---|---|
| ***H10B 51/20*** | (2023.01) |
| ***H01L 23/528*** | (2006.01) |
| ***H10B 51/10*** | (2023.01) |
| ***H10D 30/69*** | (2025.01) |
| ***H10D 64/68*** | (2025.01) |

(52) U.S. Cl.

CPC ......... *H10B 51/20* (2023.02); *H01L 23/5283* (2013.01); *H10B 51/10* (2023.02); *H10D 30/701* (2025.01); *H10D 64/689* (2025.01)

(58) Field of Classification Search

CPC ........ H10B 51/20; H10B 51/10; H10B 43/10; H10B 43/27; H10B 51/30; H10B 51/50; H10B 51/40; H01L 23/5283; H10D 30/701; H10D 64/689

USPC .......................................................... 257/295

See application file for complete search history.

(56) References Cited

U.S. PATENT DOCUMENTS

| | | | | |
|---|---|---|---|---|
| 6,370,079 | B1 * | 4/2002 | Jung | G11C 5/063 365/230.06 |
| 9,406,909 | B2 * | 8/2016 | Kim | H10K 50/30 |
| 9,524,983 | B2 * | 12/2016 | Lee | H10B 43/10 |
| 9,685,484 | B1 | 6/2017 | Rabkin et al. | |
| 10,367,004 | B2 | 7/2019 | Liu et al. | |

(Continued)

FOREIGN PATENT DOCUMENTS

| | | | |
|---|---|---|---|
| KR | 100170312 | B1 | 2/1999 |
| KR | 10-2018-0072915 | A | 7/2018 |
| KR | 10-2020-0078048 | A | 7/2020 |

*Primary Examiner* — Duy T Nguyen

(74) *Attorney, Agent, or Firm* — Wolf, Greenfield & Sacks, P.C.

(57) ABSTRACT

A semiconductor device includes first and second cell arrays. The first cell array includes a first gate electrode that extends in a vertical direction, a first channel pattern on a side surface of the first gate electrode, and a first bit line electrically connected to the first channel pattern. The second cell array includes a second gate electrode that extends in the vertical direction, a second channel pattern on a side surface of the second gate electrode, and a second bit line electrically connected to the second channel pattern. A first bit line pad is electrically connected to the first bit line and a second bit line pad is electrically connected to the second bit line. The first bit line pad is spaced apart from the second bit line pad with the first and second cell arrays therebetween.

20 Claims, 24 Drawing Sheets

(56) References Cited

U.S. PATENT DOCUMENTS

| | | | | |
|---|---|---|---|---|
| 10,833,101 | B2 | 11/2020 | Shimomura et al. | |
| 11,164,890 | B2 | 11/2021 | Zhang et al. | |
| 2006/0077702 | A1* | 4/2006 | Sugimae | H10B 41/42 257/E27.081 |
| 2008/0149913 | A1* | 6/2008 | Tanaka | H10B 63/34 438/238 |
| 2020/0203427 | A1* | 6/2020 | Noh | H10B 63/84 |
| 2020/0357822 | A1* | 11/2020 | Chen | G11C 11/223 |
| 2021/0020659 | A1 | 1/2021 | Chen | |
| 2021/0202519 | A1* | 7/2021 | Ku | H01L 23/5226 |
| 2021/0210551 | A1 | 7/2021 | Han | |
| 2021/0408043 | A1 | 12/2021 | Yeong et al. | |
| 2022/0005830 | A1 | 1/2022 | Wu et al. | |

* cited by examiner

HIGHLY INTEGRATED SEMICONDUCTOR DEVICE

CROSS-REFERENCE TO RELATED APPLICATIONS

This U.S. non-provisional patent application claims priority under 35 U.S.C. § 119 to Korean Patent Application No. 10-2022-0104011, filed on Aug. 19, 2022, in the Korean Intellectual Property Office, the entire contents of which are hereby incorporated by reference.

BACKGROUND OF THE INVENTION

The inventive concept relates to a semiconductor device and a method for manufacturing the same, and more particularly, relates to a semiconductor memory device including a ferroelectric field effect transistor and a method for manufacturing the same.

Semiconductor memory devices may be classified into volatile memory devices and nonvolatile memory devices. The volatile memory devices may lose their stored data when their power supplies are interrupted. For example, the volatile memory devices may include at least one of dynamic random access memory (DRAM) devices and static random access memory (SRAM) devices. The nonvolatile memory devices may retain their stored data even when their power supplies are interrupted. For example, the non-volatile memory devices may include at least one of programmable ROM (PROM), erasable PROM (EPROM), electrically EPROM (EEPROM), and/or a flash memory device. Next-generation semiconductor memory devices such as magnetic random access memory (MRAM) devices and/or phase-change random access memory (PRAM) devices have been developed to provide high-performance and/or low power consumption semiconductor memory devices. In addition, with high integration of the semiconductor devices, various studies are conducted to overcome the limitations of a manufacturing process of the semiconductor device.

SUMMARY

An object of the inventive concept is to provide a semiconductor device that is easily highly integrated and a method of manufacturing the same.

An object of the inventive concept is to provide a semiconductor device having excellent reliability and a method of manufacturing the same.

A semiconductor device according to some embodiments of the inventive concept may include a first cell array and a second cell array on a substrate and adjacent to each other in a first direction parallel to an upper surface of the substrate. The first cell array may include a first gate electrode that extends in a second direction perpendicular to the upper surface of the substrate, first channel patterns on a side surface of the first gate electrode and spaced apart from each other in the second direction, and a first bit line electrically connected to a corresponding first channel pattern among the first channel patterns. The second cell array may include a second gate electrode that extends in the second direction, second channel patterns on a side surface of the second gate electrode and spaced apart from each other in the second direction, and a second bit line electrically connected to a corresponding second channel pattern among the second channel patterns. The semiconductor device may further include a first bit line pad electrically connected to the first bit line and a second bit line pad electrically connected to the second bit line. The first bit line pad may be spaced apart from the second bit line pad in a third direction which is parallel to the upper surface of the substrate and intersects the first direction, with the first and second cell arrays therebetween.

A semiconductor device according to some embodiments of the inventive concept may include a first cell array on a substrate. The first cell array may include a first bit line and a first source line spaced apart from each other in a first direction parallel to an upper surface of the substrate, a first gate electrode disposed between the first bit line and the first source line and that extends in a second direction perpendicular to the upper surface of the substrate, and first channel patterns on a side surface of the first gate electrode and spaced apart from each other in the second direction. The semiconductor device may further include a first bit line pad electrically connected to the first bit line and a first source line pad electrically connected to the first source line. The first bit line and the first source line may extend in a third direction parallel to the upper surface of the substrate and intersecting the first direction. The first bit line pad may be spaced apart from the first source line pad in the third direction with the first cell array therebetween.

A semiconductor device according to some embodiments of the inventive concept may include a first cell array and a second cell array on a substrate and adjacent to each other in a first direction parallel to an upper surface of the substrate. The first cell array may include a first gate electrode that extends in a second direction perpendicular to the upper surface of the substrate, first channel patterns on a side surface of the first gate electrode and spaced apart from each other in the second direction, and first conductive lines respectively electrically connected to the first channel patterns and spaced apart from each other in the second direction. The second cell array may include a second gate electrode that extends in the second direction, second channel patterns on a side surface of the second gate electrode and spaced apart from each other in the second direction, and second conductive lines respectively electrically connected to the second channel patterns and spaced apart from each other in the second direction. The semiconductor device may further include first conductive line pads respectively electrically connected to the first conductive lines and second conductive line pads respectively electrically connected to the second conductive lines. The first conductive line pads may be spaced apart from the second conductive line pads in a third direction which is parallel to the upper surface of the substrate and intersects the first direction, with the first and second cell arrays therebetween.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DETAILED DESCRIPTION

Hereinafter, the inventive concept will be described in detail by describing embodiments of the inventive concept with reference to the accompanying drawings.

Figure 1:
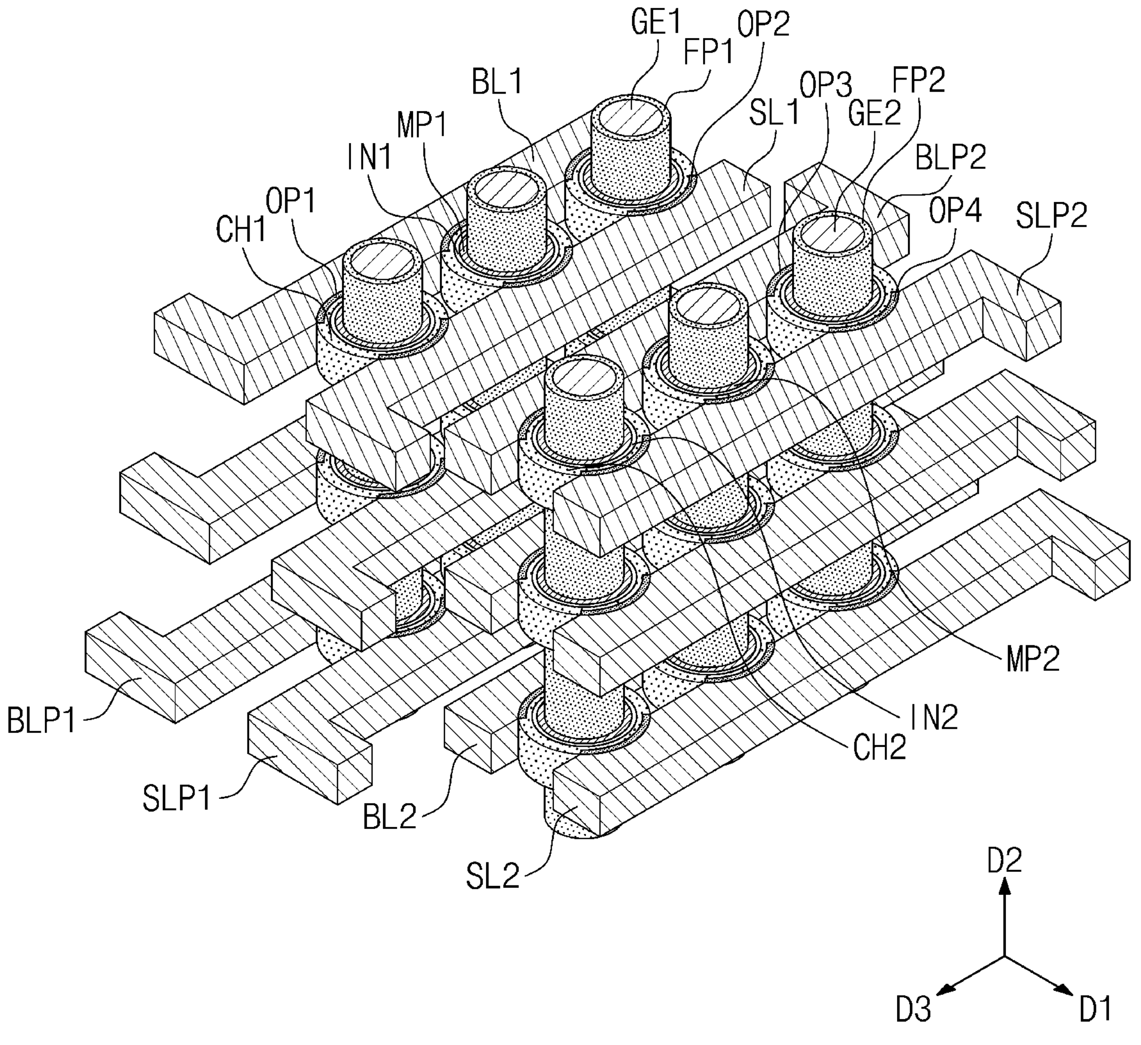
FIG. 1 is a schematic perspective view of a semiconductor device according to some embodiments of the inventive concept.
Figure 2:
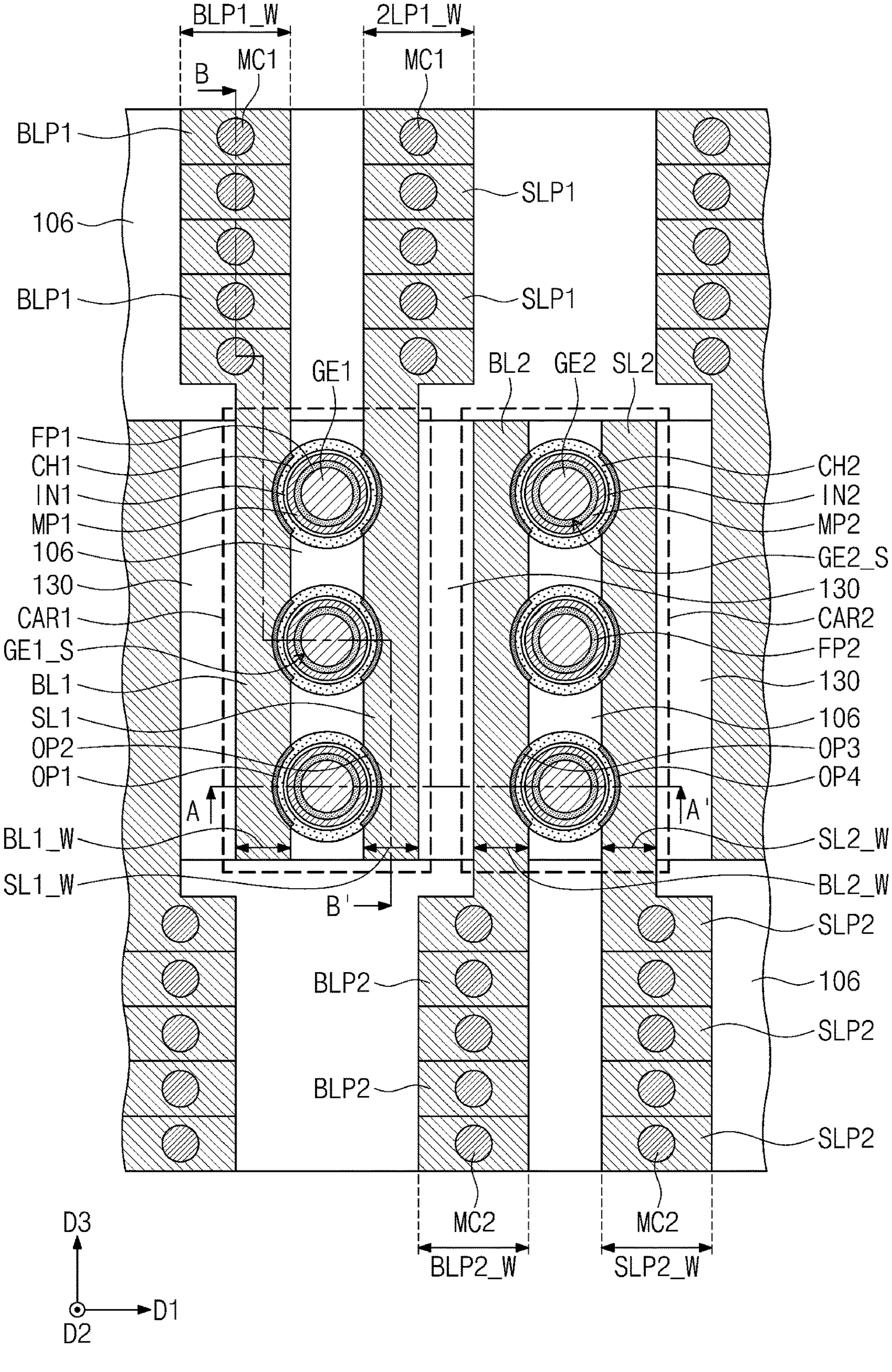
FIG. 2 is a plan view of a semiconductor device according to some embodiments of the inventive concept.
Figure 3A:
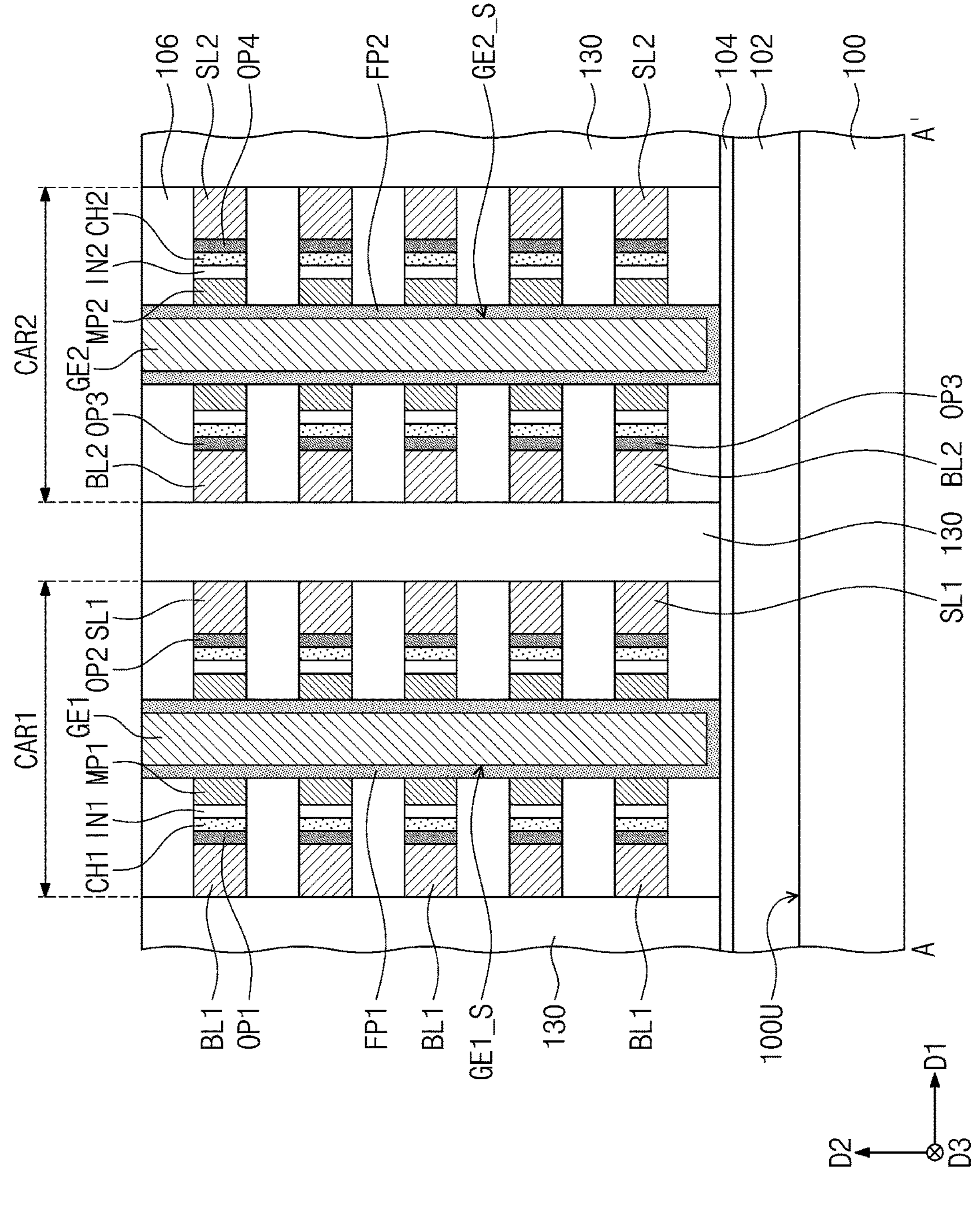
FIG. 3A is a cross-sectional view taken along line A-A' of FIG. 2.
Figure 3B:
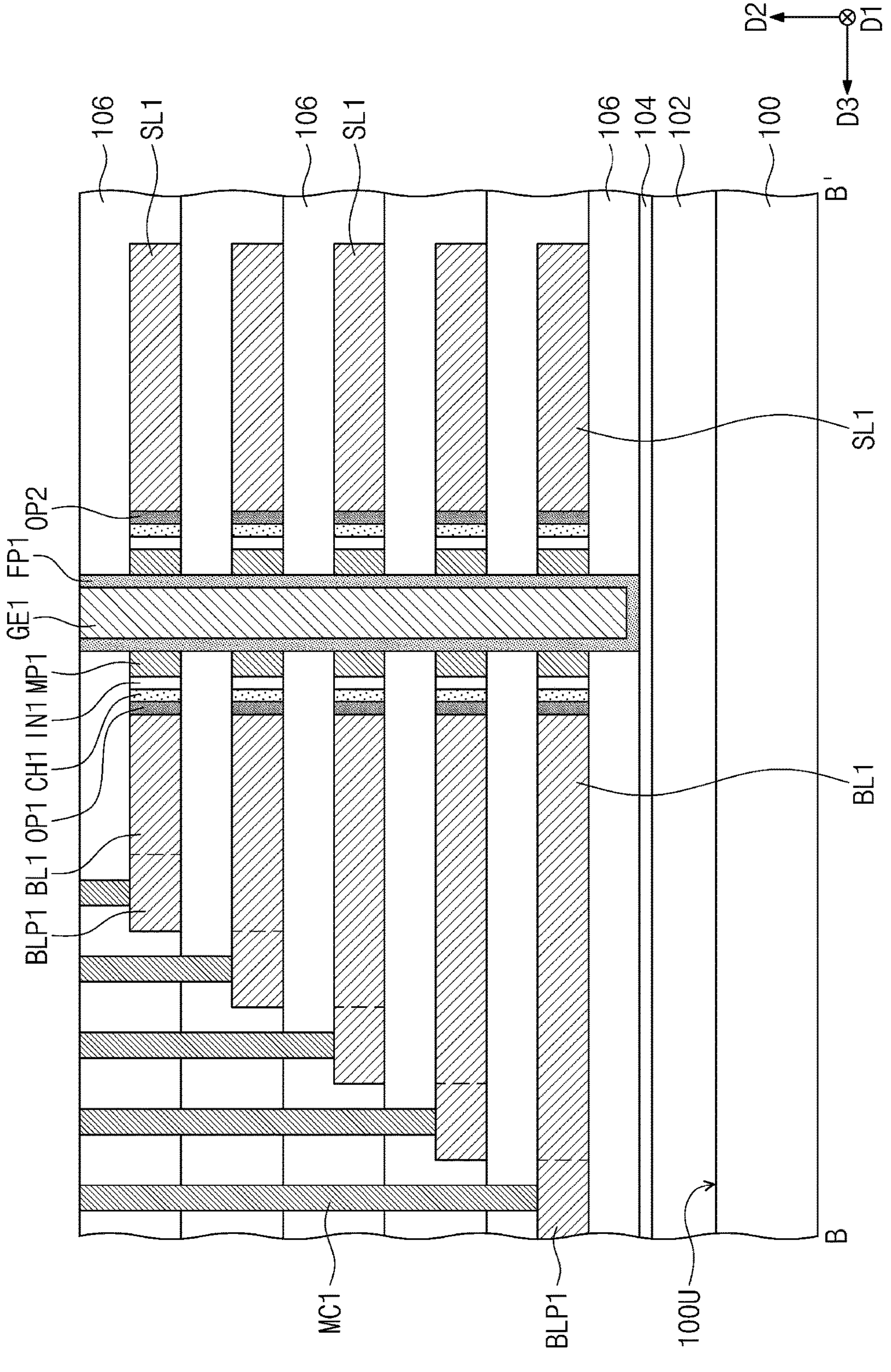
FIG. 3B is a cross-sectional view taken along line B-B' of FIG. 2.

FIG. 1 is a schematic perspective view of a semiconductor device according to some embodiments of the inventive concept. FIG. 2 is a plan view of a semiconductor device according to some embodiments of the inventive concept. FIG. 3A is a cross-sectional view taken along line A-A' of FIG. 2, and FIG. 3B is a cross-sectional view taken along line B-B' of FIG. 2.

Referring to FIGS. 1, 2, 3A, and 3B, a lower insulating layer 102 and an etch stop layer 104 may be sequentially disposed on a substrate 100. The lower insulating layer 102 may be disposed between the substrate 100 and the etch stop layer 104. The substrate 100 may include a semiconductor substrate (e.g., a silicon (Si) substrate, a germanium (Ge) substrate, or a silicon-germanium (Si—Ge) substrate). The lower insulating layer 102 may include, for example, silicon oxide, silicon nitride, and/or silicon oxynitride, and the etch stop layer 104 may include a metal oxide (e.g., aluminum oxide).

A first cell array CAR1 and a second cell array CAR2 may be disposed on the etch stop layer 104 and may neighbor or be adjacent to each other in a first direction D1 parallel to an upper surface 100U of the substrate 100.

The first cell array CAR1 may include first conductive lines BL1 and SL1 and first gate electrodes GE1. The first conductive lines BL1 and SL1 may include first bit lines BL1 spaced apart from each other in a second direction D2 perpendicular to the upper surface 100U of the substrate 100, and first source lines SL1 spaced apart from the first bit lines BL1 in the first direction D1 and spaced apart from each other in the second direction D2. The first gate electrodes GE1 may be disposed between the first bit lines BL1 and the first source lines SL1, and may extend in the second direction D2. The first bit lines BL1 and the first source lines SL1 may extend in a third direction D3 parallel to the upper surface 100U of the substrate 100, and the third direction D3 may intersect the first direction D1. The first bit lines BL1 and the first source lines SL1 may extend parallel to each other in the third direction D3. The first gate electrodes GE1 may cross the first bit lines BL1 and the first source lines SL1. The first gate electrodes GE1 may be spaced apart from each other in the third direction D3 between the first bit lines BL1 and the first source lines SL1, and may extend in the second direction D2.

The first cell array CAR1 may further include a plurality of first channel patterns CH1 surrounding a side surface GE1_S of each of the first gate electrodes GE1. The plurality of first channel patterns CH1 may surround the side surface GE1_S of each of the first gate electrodes GE1 and may be spaced apart from each other in the second direction D2. The plurality of first channel patterns CH1 may be disposed between the first bit lines BL1 and the first source lines SL1. The first bit lines BL1 may be connected to the plurality of first channel patterns CH1, respectively, and the first source lines SL1 may be connected to the plurality of first channel patterns CH1, respectively. Each of the plurality of first channel patterns CH1 may be connected to a corresponding first bit line BL1 among the first bit lines BL1, and a corresponding first source line SL1 among the first source lines SL1. Each of the plurality of first channel patterns CH1 may be disposed between the corresponding first bit line BL1 and the corresponding first source line SL1. In a cross-sectional view, the corresponding first bit line BL1, each of the plurality of first channel patterns CH1, and the corresponding first source line SL1 may be horizontally (e.g., in the first direction D1) overlap each other. Each of the first bit lines BL1 may extend in the third direction D3, and may be connected to first channel patterns CH1 spaced apart from each other in the third direction D3. Each of the first source lines SL1 may extend in the third direction D3 and may be connected to the first channel patterns CH1 spaced apart from each other in the third direction D3.

The first cell array CAR1 may further include a first ferroelectric pattern FP1 between each of the plurality of first channel patterns CH1 and the corresponding first gate electrode GE1, a first metal pattern MP1 between each of the plurality of first channel patterns CH1 and the first ferroelectric pattern FP1, and a first insulating pattern IN1 between each of the plurality of first channel patterns CH1 and the first metal pattern MP1. The first ferroelectric pattern FP1 may surround the side surface GE1_S of the corresponding first gate electrode GE1. The first metal pattern MP1 may surround the side surface GE1_S of the corresponding first gate electrode GE1 and may be spaced apart from the side surface GE1_S of the corresponding first gate electrode GE1 with the first ferroelectric pattern FP1 interposed therebetween. The first insulating pattern IN1 may surround the side surface GE1_S of the corresponding first gate electrode GE1 and may be spaced apart from the side surface GE1_S of the corresponding first gate electrode GE1 with the first ferroelectric pattern FP1 and the first metal pattern MP1 interposed therebetween.

The first cell array CAR1 may further include first impurity patterns OP1 between the first bit lines BL1 and the plurality of first channel patterns CH1, and second impurity patterns OP2 between the first source lines SL1 and the plurality of first channel patterns CH1. The first impurity patterns OP1 may be spaced apart from each other in the second direction D2 and may be interposed between the first bit lines BL1 and the plurality of first channel patterns CH1, respectively. The second impurity patterns OP2 may be spaced apart from each other in the second direction D2 and may be interposed between the first source lines SL1 and the plurality of first channel patterns CH1, respectively. The second impurity patterns OP2 may be spaced apart from the first impurity patterns OP1 in the first direction D1 with the plurality of first channel patterns CH1, the first insulating pattern IN1, the first metal pattern MP1, the first ferroelectric pattern FP1, and the corresponding first gate electrode GE1 interposed therebetween. The first bit lines BL1 may be electrically connected to the plurality of first channel patterns CH1 through the first impurity patterns OP1, respectively, and the first source lines SL1 may be electrically connected to the plurality of first channel patterns CH1 through the second impurity patterns OP2, respectively. The corresponding first gate electrode GE1, each of the plurality of first channel patterns CH1 surrounding the corresponding side surface GE1_S of the first gate electrode GE1, the first ferroelectric pattern FP1 interposed between each of the plurality of first channel patterns CH1 and the corresponding first gate electrode GE1, the first metal pattern MP1, the first insulating pattern IN1, and a corresponding first impurity pattern OP1 and a corresponding second impurity pattern OP2 disposed on both sides of each of the plurality of first channel patterns CH1 may be a ferroelectric field effect transistor.

First conductive line pads BLP1 and SLP1 may be disposed on one side of the first cell array CAR1. The first conductive line pads BLP1 and SLP1 may include first bit line pads BLP1 and first source line pads SLP1.

The first bit line pads BLP1 may be disposed on the one side of the first cell array CAR1 and may be respectively connected to the first bit lines BL1. The first bit lines BL1 may extend longer in the third direction D3 as the first bit lines BL1 are closer to the substrate 100, and the first bit line pads BLP1 may be connected to ends of the first bit line BL1, respectively. Each of the first bit line pads BLP1 and each of the first bit lines BL1 may be connected to each other to form an integral body. The first bit line pads BLP1 may be stacked in the second direction D2 on the one side of the first cell array CAR1 to form a stepped structure. A width BLP1_W of each of the first bit line pads BLP1 in the first direction D1 may be greater than a width BL1_W of each of the first bit lines BL1 in the first direction D1.

The first source line pads SLP1 may be disposed on the one side of the first cell array CAR1 and may be respectively connected to the first source lines SL1. The first source lines SL1 may extend longer in the third direction D3 as the source lines SL1 are closer to the substrate 100, and the first source line pads SLP1 may be connected to ends of the first source lines SL1, respectively. Each of the first source line pads SLP1 and each of the first source lines SL1 may be connected to each other to form an integral body. The first source line pads SLP1 may be stacked in the second direction D2 on the one side of the first cell array CAR1 to form a stepped structure. A width SLP1_W of each of the first source line pads SLP1 in the first direction D1 may be greater than a width SL1_W of each of the first source lines SL1 in the first direction D1.

The first bit line pads BLP1 and the first source line pads SLP1 may be disposed on the same side of the first cell array CAR1 and be spaced apart from each other in the first direction D1. The first source line pads SLP1 may neighbor or be adjacent to the first bit line pads BLP1 in the first direction D1. First conductive contacts MC1 may be respectively disposed on the first bit line pads BLP1 and the first source line pads SLP1, and may be electrically connected to the first bit line pads BLP1 and the first source line pads SLP1, respectively.

The second cell array CAR2 may include second conductive lines BL2 and SL2 and second gate electrodes GE2. The second conductive lines BL2 and SL2 may include second bit lines BL2 spaced apart from each other in the second direction D2, and second source lines SL2 spaced apart from the second bit lines BL2 in the first direction D1 and spaced apart from each other in the second direction D2. The second gate electrodes GE2 may be disposed between the second bit lines BL2 and the second source lines SL2 and may extend in the second direction D2. The second bit lines BL2 may be spaced apart from the first bit lines BL1 and the first source lines SL1 in the first direction D1. The second bit lines BL2 and the second source lines SL2 may extend parallel to each other in the third direction D3. The second gate electrodes GE2 may cross the second bit lines BL2 and the second source lines SL2. The second gate electrodes GE2 may be spaced apart from each other in the third direction D3 between the second bit lines BL2 and the second source lines SL2 and may extend in the second direction D2.

The second cell array CAR2 may further include a plurality of second channel patterns CH2 surrounding a side surface GE2_S of each of the second gate electrodes GE2. The plurality of second channel patterns CH2 may surround the side surface GE2_S of each of the second gate electrodes GE2 and may be spaced apart from each other in the second direction D2. The plurality of second channel patterns CH2 may be disposed between the second bit lines BL2 and the second source lines SL2. The second bit lines BL2 may be connected to the plurality of second channel patterns CH2, respectively, and the second source lines SL2 may be respectively connected to the plurality of second channel patterns CH2. Each of the plurality of second channel patterns CH2 may be connected to a corresponding second bit line BL2 among the second bit lines BL2 and a corresponding second source line SL2 among the second source lines SL2. Each of the plurality of second channel patterns CH2 may be disposed between the corresponding second bit line BL2 and the corresponding second source line SL2. In a cross-sectional view, the corresponding second bit line BL2, each of the plurality of second channel patterns CH2, and the corresponding second source line SL2 may horizontally (e.g., in the first direction D1) overlap each other. Each of the second bit lines BL2 may extend in the third direction D3, and may be connected to second channel patterns CH2 spaced apart from each other in the third direction D3. Each of the second source lines SL2 may extend in the third direction D3 and may be connected to the second channel patterns CH2 spaced apart from each other in the third direction D3.

The second cell array CAR2 may further include a second ferroelectric pattern FP2 between each of the plurality of second channel patterns CH2 and the corresponding second gate electrode GE2, a second metal pattern MP2 between each of the plurality of second channel patterns CH2 and the second ferroelectric pattern FP2, and a second insulating pattern IN2 between each of the plurality of second channel patterns CH2 and the second metal pattern MP2. The second ferroelectric pattern FP2 may surround the side surface GE2_S of the corresponding second gate electrode GE2. The second metal pattern MP2 may surround the side surface GE2_S of the corresponding second gate electrode GE2 and the corresponding second gate electrode and may be spaced apart from the side surface GE2_S of the corresponding second gate electrode GE2 with the second ferroelectric pattern FP2 interposed therebetween. The second insulating pattern IN2 may surround the side surface GE2_S of the corresponding second gate electrode GE2, and may be spaced apart from the side surface GE2_S of the corresponding second gate electrode GE2 with the second ferroelectric pattern FP2 and the second metal pattern MP2 interposed therebetween.

The second cell array CAR2 may further include third impurity patterns OP3 between the second bit lines BL2 and the plurality of second channel patterns CH2, and fourth impurity patterns OP4 between the second source lines SL2 and the plurality of second channel patterns CH2. The third impurity patterns OP3 may be spaced apart from each other in the second direction D2, and may be interposed between the second bit lines BL2 and the plurality of second channel patterns CH2, respectively. The fourth impurity patterns OP4 may be spaced apart from each other in the second direction D2, and may be interposed between the second source lines SL2 and the plurality of second channel patterns CH2, respectively. The fourth impurity patterns OP4 may be spaced apart from the third impurity patterns OP3 with the plurality of second channel patterns CH2, the second insulating pattern IN2, the second metal pattern MP2, the second ferroelectric pattern FP2, and the corresponding second gate electrode GE2 in the first direction D1 therebetween. The second bit lines BL2 may be electrically connected to the plurality of second channel patterns CH2 through the third impurity patterns OP3, respectively, and the second source lines SL2 may be electrically connected to the plurality of second channel patterns CH2 through the fourth impurity patterns OP4, respectively. The corresponding second gate electrode GE2, each of the plurality of second channel patterns CH2 surrounding the side surface GE2_S of the corresponding second gate electrode GE2, the second ferroelectric pattern FP2 interposed between each of the plurality of second channel patterns CH2 and the corresponding second gate electrode GE2, the second metal pattern MP2 and the second insulating pattern IN2, and a corresponding third impurity pattern OP3 and a corresponding fourth impurity pattern OP4 disposed on both sides of each of the plurality of second channel patterns CH2 may be a ferroelectric field effect transistor.

Second conductive line pads BLP2 and SLP2 may be disposed on one side of the second cell array CAR2. The second conductive line pads BLP2 and SLP2 may include second bit line pads BLP2 and second source line pads SLP2.

The second bit line pads BLP2 may be disposed on the one side of the second cell array CAR2 and may be respectively connected to the second bit lines BL2. The second bit lines BL2 may extend longer in a direction opposite to the third direction D3 as the second bit lines BL2 are closer to the substrate 100, and the second bit line pads BLP2 may be connected to ends of the second bit lines BL2, respectively. Each of the second bit line pads BLP2 and each of the second bit lines BL2 may be connected to each other to form an integral body. The second bit line pads BLP2 may be stacked in the second direction D2 on the one side of the second cell array CAR2 to form a stepped structure. A width BLP2_W of each of the second bit line pads BLP2 in the first direction D1 may be greater than a width BL2_W of each of the second bit lines BL2 in the first direction D1.

The second source line pads SLP2 may be disposed on the one side of the second cell array CAR2 and may be respectively connected to the second source lines SL2. The second source lines SL2 may extend longer in a direction opposite to the third direction D3 as the second source lines SL2 closer to the substrate 100, and the second source line pads SLP2 may be connected to ends of the second source lines SL2, respectively. Each of the second source line pads SLP2 and each of the second source lines SL2 may be connected to each other to form an integral body. The second source line pads SLP2 may be stacked in the second direction D2 on the one side of the second cell array CAR2 to form a stepped structure. A width SLP2_W of each of the second source line pads SLP2 in the first direction D1 may be greater than a width SLP2_W of each of the second source lines SL2 in the first direction D1.

The second bit line pads BLP2 and the second source line pads SLP2 may be disposed on the same side of the second cell array CAR2 and be spaced apart from each other in the first direction D1. The second source line pads SLP2 may neighbor or be adjacent to the second bit line pads BLP2 in the first direction D1. The first bit line pads BLP1 and the first source line pads SLP1 may be spaced apart from the second bit line pads BLP2 and the second source line pads SLP2 in the third direction D3 with the first cell array CAR1 and the second cell array CAR2 interposed therebetween. Second conductive contacts MC2 may be disposed on the second bit line pads BLP2 and the second source line pads SLP2, respectively, and each of the second bit line pads BLP2 and the second source line pads SLP2 may be electrically connected to each other.

The first bit lines BL1, the first bit line pads BLP1, the first source lines SL1, the first source line pads SLP1, and the second bit lines BL2, the second bit line pads BLP2, the second source lines SL2, and the second source line pads SLP2 may include a conductive material, and for example, may include doped polysilicon, metal, conductive metal nitride, conductive metal silicide, conductive metal oxide, or a combination thereof. The first bit lines BL1, the first bit line pads BLP1, the first source lines SL1, the first source line pads SLP1, and the second bit lines BL2, the second bit line pads BLP2, the second source lines SL2, and the second source line pads SLP2 may be formed of, for example, doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or a combination thereof. However, the inventive concept is not limited thereto. The first bit lines BL1, the first bit line pads BLP1, the first source lines SL1, the first source line pads SLP1, and the second bit lines BL2, the second bit line pads BLP2, the second source lines SL2, and the second source line pads SLP2 may include a two-dimensional semiconductor material, and for example, the two-dimensional semiconductor material may include graphene, carbon nanotubes, or a combination thereof.

The first and second gate electrodes GE1 and GE2 may include doped polysilicon, metal, conductive metal nitride, conductive metal silicide, conductive metal oxide, or a combination thereof. The first and second gate electrodes GE1 and GE2 may be formed of, for example, doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or a combination thereof, but is not limited thereto.

The first and second channel patterns CH1 and CH2 may include silicon (e.g., polycrystalline silicon, doped silicon, or single crystal silicon), germanium, silicon-germanium, or an oxide semiconductor. The oxide semiconductor may include InGaZnO (IGZO), Sn—InGaZnO, InWO (IWO), $CuS_2$, $CuSe_2$, $WSe_2$, InGaSiO, InSnZnO, InZnO (IZO), ZnO, ZnTiO (ZTO), YZnO (YZO), ZnSnO, ZnON, ZrZnSnO, SnO, HfInZnO, GaZnSnO, AlZnSnO, YbGaZnO, InGaO, or a combination thereof. The first and second channel patterns CH1 and CH2 may include a two-dimensional semiconductor material, and for example, the two-dimensional semiconductor material may include $MoS_2$, $MoSe_2$, $WS_2$, graphene, carbon nanotubes (carbon nanotube) or a combination thereof.

The first and second ferroelectric patterns FP1 and FP2 may include hafnium (Hf) oxide having ferroelectric properties. The first and second ferroelectric patterns FP1 and FP2 may further include a dopant, and the dopant may be at least one of Zr, Si, Al, Y, Gd, La, Sc, and/or Sr. The first and second ferroelectric patterns FP1 and FP2 may include, for example, $HfO_2$, HfZnO, HfSiO, HfSiON, HfTaO, HfSiO, HfZrO, or a combination thereof. The first and second ferroelectric patterns FP1 and FP2 may have an orthorhombic phase. The first and second metal patterns MP1 and MP2 may include a metal (e.g., Pt, etc.) and/or a metal oxide (e.g., $RuO_2$, $IrO_2$, $LaSrCoO_3$, etc.). The first and second metal patterns MP1 and MP2 may be used to easily maintain the polarization of the first and second ferroelectric patterns FP1 and FP2. In some embodiments, the first and second metal patterns MP1 and MP2 may be omitted. The first and second insulating patterns IN1 and IN2 may include a silicon oxide layer, a silicon oxynitride layer, a high-k layer having a higher dielectric constant than a dielectric constant of the silicon oxide layer, or a combination thereof. The high-k layer may include a metal oxide or a metal oxynitride.

The first impurity patterns OP1 and the second impurity patterns OP2 may include impurities having the same conductivity type. The first impurity patterns OP1 and the second impurity patterns OP2 may include, for example, an N-type impurity or a P-type impurity. The third impurity patterns OP3 and the fourth impurity patterns OP4 may include impurities having the same conductivity type. The third impurity patterns OP3 and the fourth impurity patterns OP4 may include, for example, an N-type impurity or a P-type impurity.

The first and second conductive contacts MC1 and MC2 may include a conductive material, and for example, may include doped polysilicon, metal, conductive metal nitride, conductive metal silicide, conductive metal oxide, or a combination thereof.

Interlayer insulating layers 106 may be interposed between the plurality of first channel patterns CH1 of the first cell array CAR1. The interlayer insulating layers 106 and the plurality of first channel patterns CH1 may be alternately stacked in the second direction D2. The plurality of first channel patterns CH1 may be electrically separated (or insulated) from each other by the interlayer insulating layers 106. The interlayer insulating layers 106 may surround the side surface GE1_S of the corresponding first gate electrode GE1. The interlayer insulating layers 106 may extend between the first impurity patterns OP1 and between the first bit lines BL1, and may extend between the second impurity patterns OP2 and between the first source lines SL1. The interlayer insulating layers 106 may extend between first insulating patterns IN1 adjacent to each other in the second direction D2 and between first metal patterns MP1 adjacent to each other in the second direction D2. That is, the first insulating pattern IN1 and the first metal pattern MP1 may be interposed between interlayer insulating layers 106 adjacent to each other in the second direction D2 among the interlayer insulating layers 106. The first ferroelectric pattern FP1 may extend between each of the interlayer insulating layers 106 and the corresponding first gate electrode GE1. The interlayer insulating layers 106 may be in contact with side surfaces of the first ferroelectric pattern FP1.

The interlayer insulating layers 106 may be interposed between the plurality of second channel patterns CH2 of the second cell array CAR2. The interlayer insulating layers 106 and the plurality of second channel patterns CH2 may be alternately stacked in the second direction D2. The plurality of second channel patterns CH2 may be electrically separated (or insulated) from each other by the interlayer insulating layers 106. The interlayer insulating layers 106 may surround the side surface GE2_S of the corresponding second gate electrode GE2. The interlayer insulating layers 106 may extend between the third impurity patterns OP3 and between the second bit lines BL2, and may extend between the fourth impurity patterns OP4 and between the second source lines SL2. The interlayer insulating layers 106 may extend between second insulating patterns IN2 adjacent to each other in the second direction D2, and second metal patterns MP2 adjacent to each other in the second direction D2. That is, the second insulating pattern IN2 and the second metal pattern MP2 may be interposed between interlayer insulating layers 106 adjacent to each other in the second direction D2 among the interlayer insulating layers 106. The second ferroelectric pattern FP2 may extend between each of the interlayer insulating layers 106 and the corresponding second gate electrode GE2. The interlayer insulating layers 106 may be in contact with side surfaces of the second ferroelectric pattern FP2.

The interlayer insulating layers 106 may extend in the third direction D3 and may be interposed between the first bit line pads BLP1 and between the first source line pads SLP1. The interlayer insulating layers 106 may cover or overlap the first bit line pads BLP1 and the first source line pads SLP1. Each of the first conductive contacts MC1 may pass through a corresponding interlayer insulating layer 106 of the interlayer insulating layer 106, and may be connected to a corresponding one of the first bit line pads BLP1 and the first source line pads SLP1. The interlayer insulating layers 106 may extend in a direction opposite to the third direction D3 and may be interposed between the second bit line pads BLP2 and the second source line pads SLP2. The interlayer insulating layers 106 may cover or overlap the second bit line pads BLP2 and the second source line pads SLP2. Each of the second conductive contacts MC2 may pass through a corresponding interlayer insulating layer 106 of the interlayer insulating layer 106 and may be connected to a corresponding one of the second bit line pads BLP2 and the second source line pads SLP2. The interlayer insulating layers 106 may include, for example, silicon oxide.

Sidewall insulating patterns 130 may be disposed on the etch stop layer 104 and on both sides of each of the first cell array CAR1 and the second cell array CAR2. The sidewall insulating patterns 130 may be spaced apart from each other in the first direction D1 with each of the first cell array CAR1 and the second cell array CAR2 interposed therebetween. The sidewall insulating patterns 130 may extend in the second direction D2 and the third direction D3. One of the sidewall insulating patterns 130 may extend in the second direction D2 to cover or be on side surfaces of the first bit lines BL1 and the interlayer insulating layers 106, and may extend in the third direction D3 along the side surfaces of the first bit lines BL1. Another one of the sidewall insulating patterns 130 may extend in the second direction D2 to cover or be on side surfaces of the first source lines SL1, the interlayer insulating layers 106, and the second bit lines BL2, and may extend in the third direction D3 along the side surfaces of the first source lines SL1 and the second bit lines BL2. Another one of the sidewall insulating patterns 130 may extend in the second direction D2 to cover or be on side surfaces of the second source lines SL2 and the interlayer insulating layers 106, and may extend along the side surfaces of the second source lines SL2 in the third direction D3. The sidewall insulating patterns 130 may include, for example, silicon oxide, silicon nitride, and/or silicon oxynitride.

According to the present embodiments, the first bit line pads BLP1 and the first source line pads SLP1 may be spaced apart from the second bit line pads BLP2 and the second source line pads SLP2 in the third direction D3 with the first cell array CAR1 and the second cell array CAR2 interposed therebetween. That is, the first bit line pads BLP1 and the first source line pads SLP1 connected to the first cell array CAR1 may be disposed in an opposite direction to the second bit line pads BLP2 and the second source line pads SLP2 connected to the second cell array CAR2. Accordingly, it may be easy to increase the widths BLP1_W, BLP2_W, SLP1_W, and SLP2_W of the first and second bit line pads BLP1 and BLP2 and the first and second source line pads SLP1 and SLP2, and as a result, the first conductive contacts MC1 may be easily formed on the first bit line pads BLP1 and the first source line pads SLP1, and the second conductive contacts MC2 may be easily formed on the second bit line pads BLP2 and the second source line pads SLP2. Therefore, a semiconductor device that is easily highly integrated and has excellent reliability may be provided.

FIGS. 4, 6, 8, 10, 12, and 14 are plan views illustrating a method of manufacturing a semiconductor device according to some embodiments of the inventive concept. FIGS. 5A, 7A, 9A, 11A, 13A, and 15A are cross-sectional views corresponding to A-A' of FIGS. 4, 6, 8, 10, 12, and 14, respectively, and FIGS. 5B, 7B, 9B, 11B, 13B, and 15B are cross-sectional views corresponding to B-B' of FIGS. 4, 6, 8, 10, 12, and 14, respectively. For simplification of description, descriptions overlapping those of the semiconductor device described with reference to FIGS. 1, 2, 3A, and 3B will be omitted.

Figure 4:
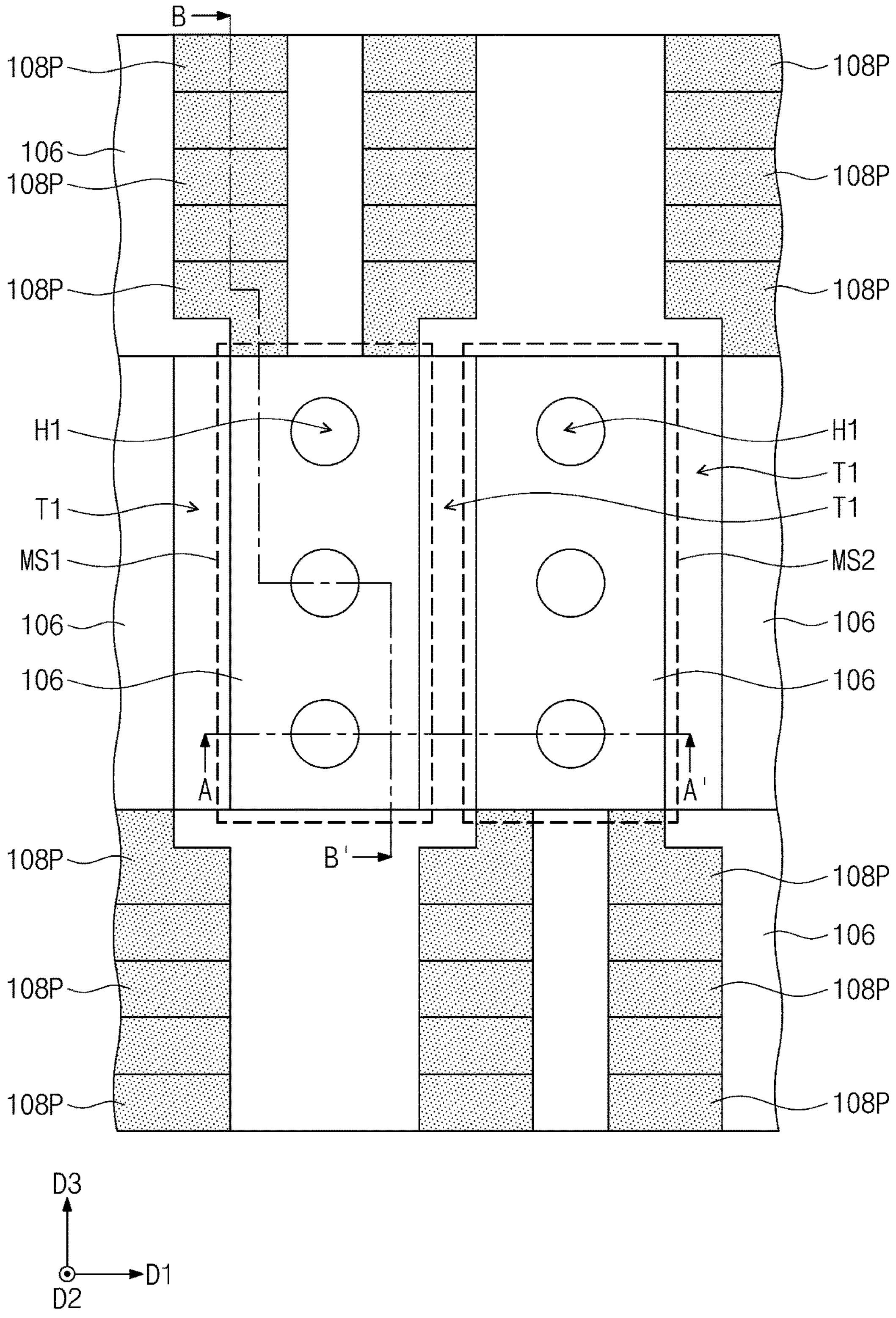
FIGS. 4, 6, 8, 10, 12, and 14 are plan views illustrating a method of manufacturing a semiconductor device according to some embodiments of the inventive concept.
Figure 5A:
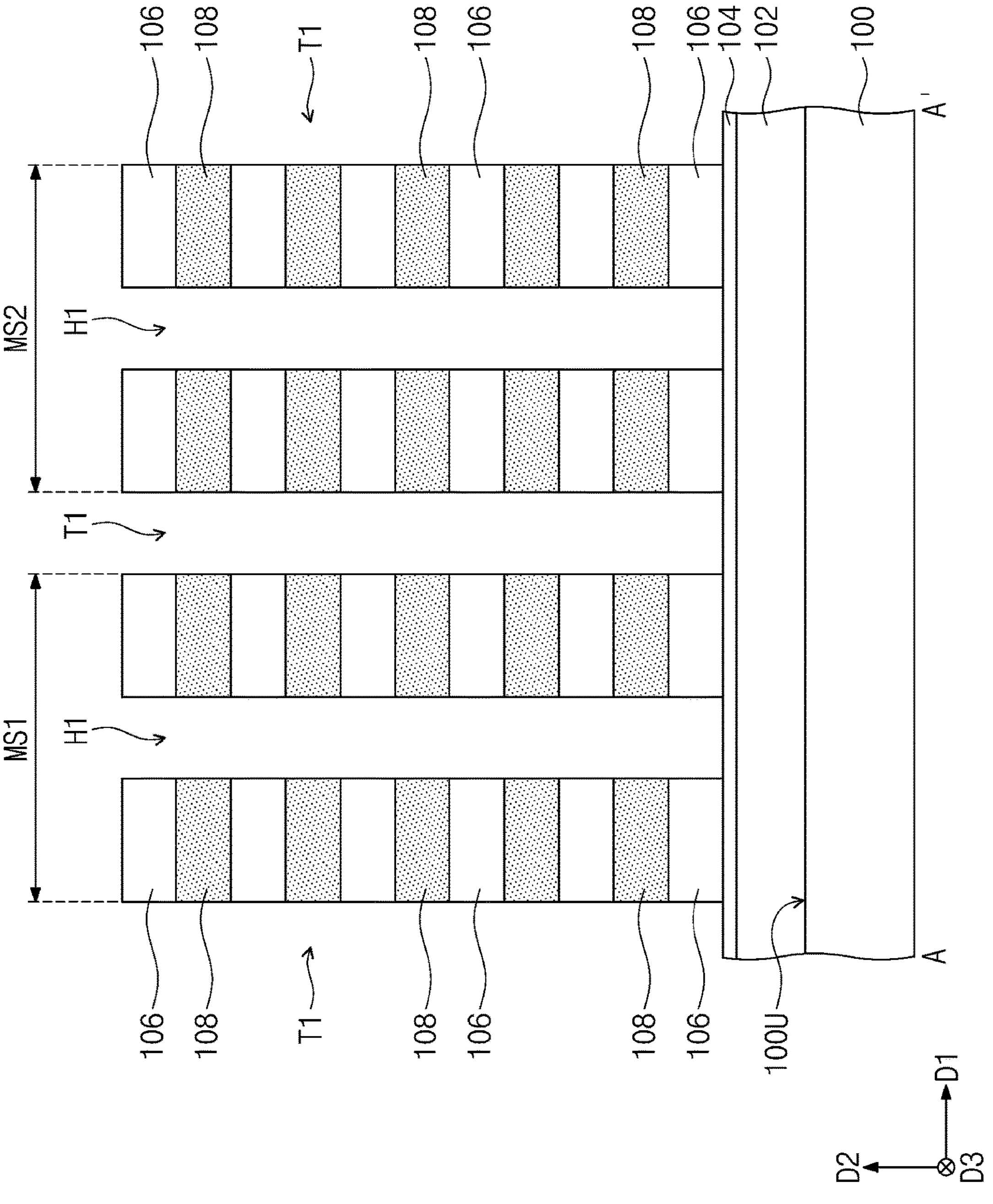
FIGS. 5A, 7A, 9A, 11A, 13A, and 15A are cross-sectional views corresponding to A-A' of FIGS. 4, 6, 8, 10, 12, and 14, respectively.
Figure 5B:
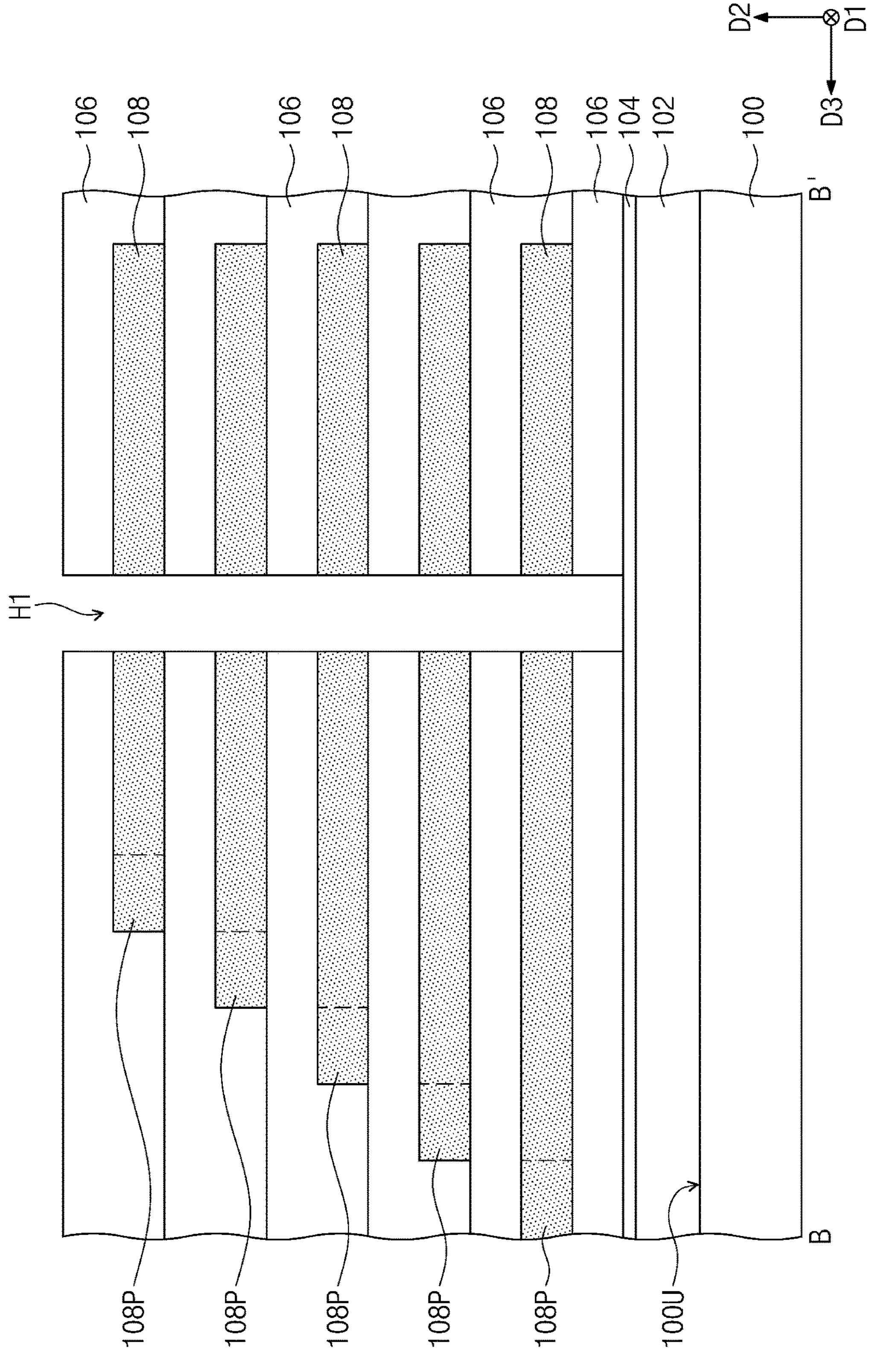
FIGS. 5B, 7B, 9B, 11B, 13B, and 15B are cross-sectional views corresponding to B-B' of FIGS. 4, 6, 8, 10, 12, and 14, respectively.

Referring to FIGS. 4, 5A, and 5B, a lower insulating layer 102 and an etch stop layer 104 may be sequentially formed on a substrate 100. Interlayer insulating layers 106 and sacrificial layers 108 may be stacked on the etch stop layer 104. The interlayer insulating layers 106 and the sacrificial layers 108 may be alternately stacked in the second direction D2 perpendicular to an upper surface 100U of the substrate 100. The lowermost interlayer insulating layer 106 of the interlayer insulating layers 106 may be interposed between the lowest sacrificial layer 108 of the sacrificial layers 108 and the etch stop layer 104, and the uppermost interlayer insulating layer 106 of the interlayer insulating layers 106 may be disposed on the uppermost sacrificial layer 108 of the sacrificial layers 108. The sacrificial layers 108 may include sacrificial pads 108P extending in a third direction D3 parallel to the upper surface 100U of the substrate 100 or in a direction opposite to the third direction D3, respectively. The interlayer insulating layers 106 may include, for example, silicon oxide. The sacrificial layers 108 may include a material having etch selectivity with respect to the interlayer insulating layers 106, and may include, for example, silicon nitride.

First trenches T1 may be formed in the interlayer insulating layers 106 and the sacrificial layers 108. Each of the first trenches T1 may pass through the interlayer insulating layers 106 and the sacrificial layers 108 in the second direction D2, and may expose an upper surface of the etch stop layer 104. The first trenches T1 may be spaced apart from each other in the first direction D1 parallel to the upper surface 100U of the substrate 100, and may extend in the third direction D3 parallel to the upper surface 100U of the substrate 100. The third direction D3 may cross the first direction D1. Forming the first trenches T1 may include, for example, anisotropically etching the interlayer insulating layers 106 and the sacrificial layers 108.

A first mold structure MS1 and a second mold structure MS2 may be defined by the first trenches T1. Each of the first and second mold structures MS1 and MS2 may include the interlayer insulating layers 106 and the sacrificial layers 108 between a pair of the first trenches T1. The first trenches T1 may be spaced apart from each other in the first direction D1 with the first and second mold structures MS1 and MS2 interposed therebetween, may extend in the third direction D3. The first and second mold structures MS1 and MS2 may be spaced apart from each other in the first direction D1, and may extend in the third direction D3 between the first trenches T1.

The sacrificial layers 108 of the first mold structure MS1 may extend in the third direction D3, and may include the sacrificial pads 108P disposed on one side of the first mold structure MS1. The sacrificial pads 108P connected to the first mold structure MS1 may form a stepped structure at the one side of the first mold structure MS1. The sacrificial layers 108 of the second mold structure MS2 may extend in a direction opposite to the third direction D3, and may include the sacrificial pads 108P disposed on one side of the second mold structure MS2. The sacrificial pads 108P connected to the second mold structure MS2 may form a stepped structure at the one side of the second mold structure MS2. The sacrificial pads 108 connected to the first mold structure MS1 may be spaced apart from the sacrificial pads 108 connected to the second mold structure MS2 in the third direction D3 with the first mold structure MS1 and the second mold structure MS2 interposed therebetween. That is, the sacrificial pads 108 connected to the first mold structure MS1 may be disposed in an opposite direction to the sacrificial pads 108 connected to the second mold structure MS2. The interlayer insulating layers 106 of the first and second mold structures MS1 and MS2 may extend in the third direction D3 and in a direction opposite to the third direction D3, and may cover or overlap the sacrificial pads 108P.

First holes H1 may be formed in each of the first and second mold structures MS1 and MS2. Each of the first holes H1 may extend in the second direction D2 to pass through a corresponding one of the first and second mold structures MS1 and MS2, and may expose an upper surface of the etch stop layer 104. The first holes H1 may be spaced apart from each other in the third direction D3 between the first trenches T1. Forming the first holes H1 may include, for example, anisotropically etching the interlayer insulating layers 106 and the sacrificial layers 108.

Figure 6:
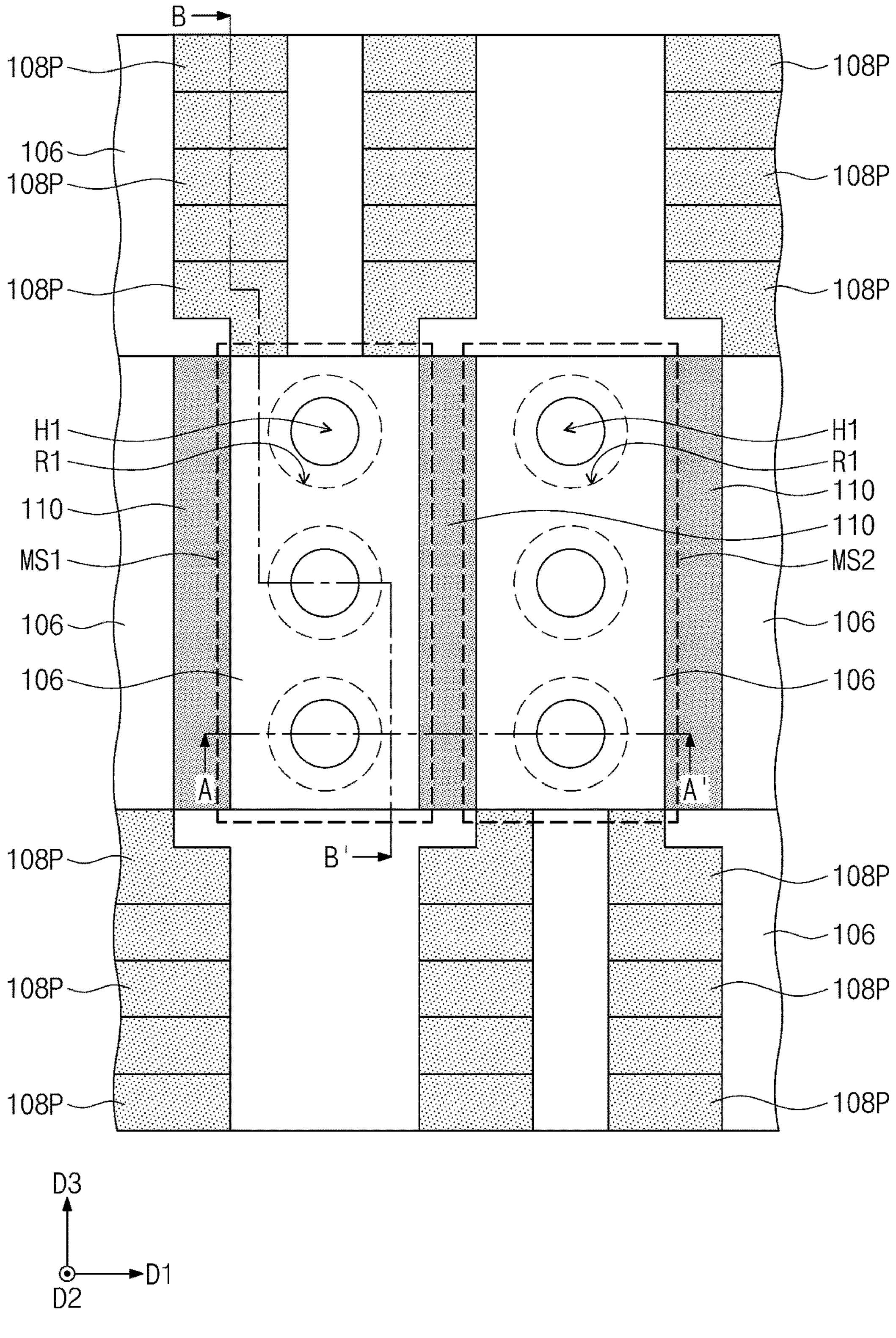
Figure 7A:
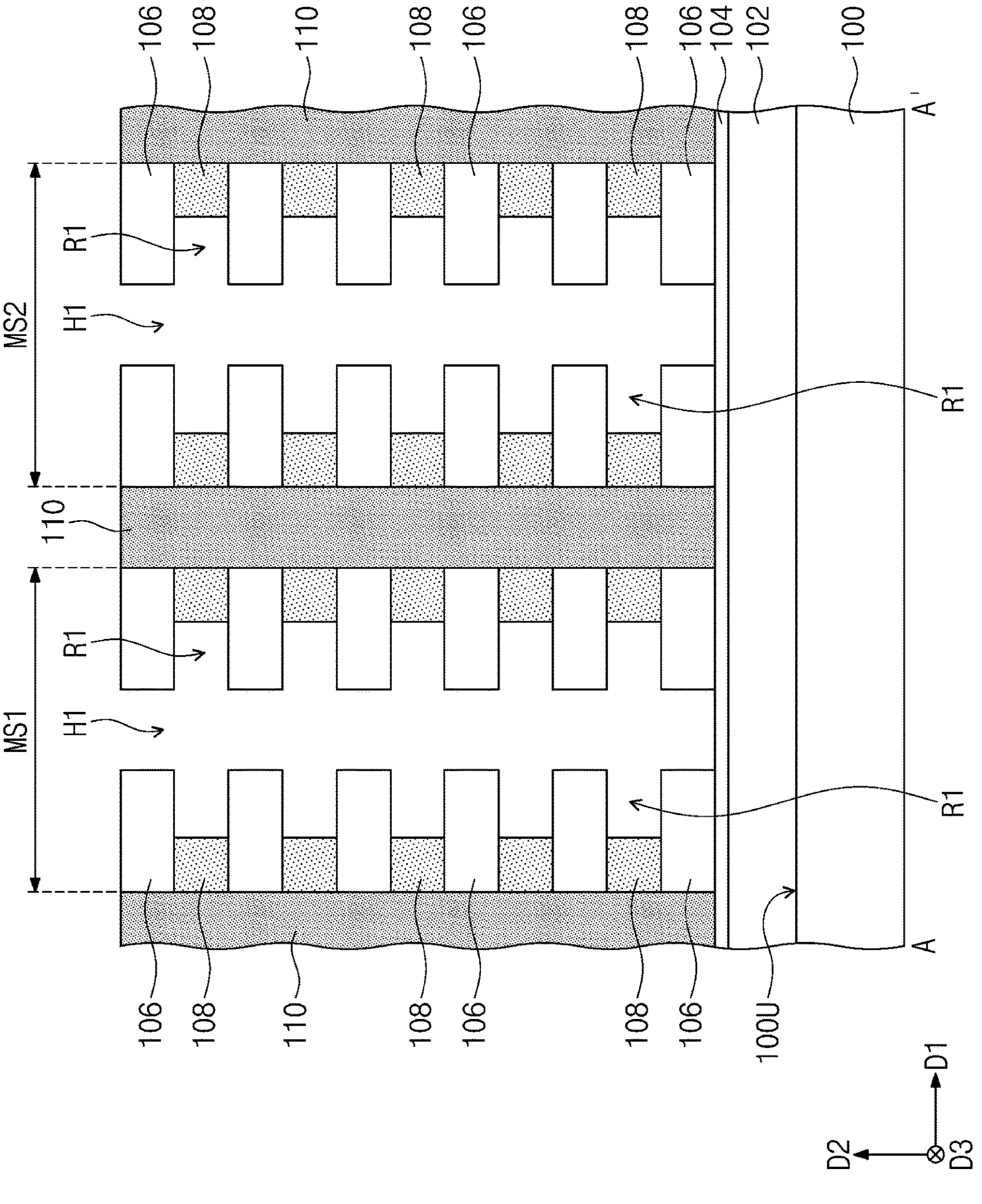
Figure 7B:
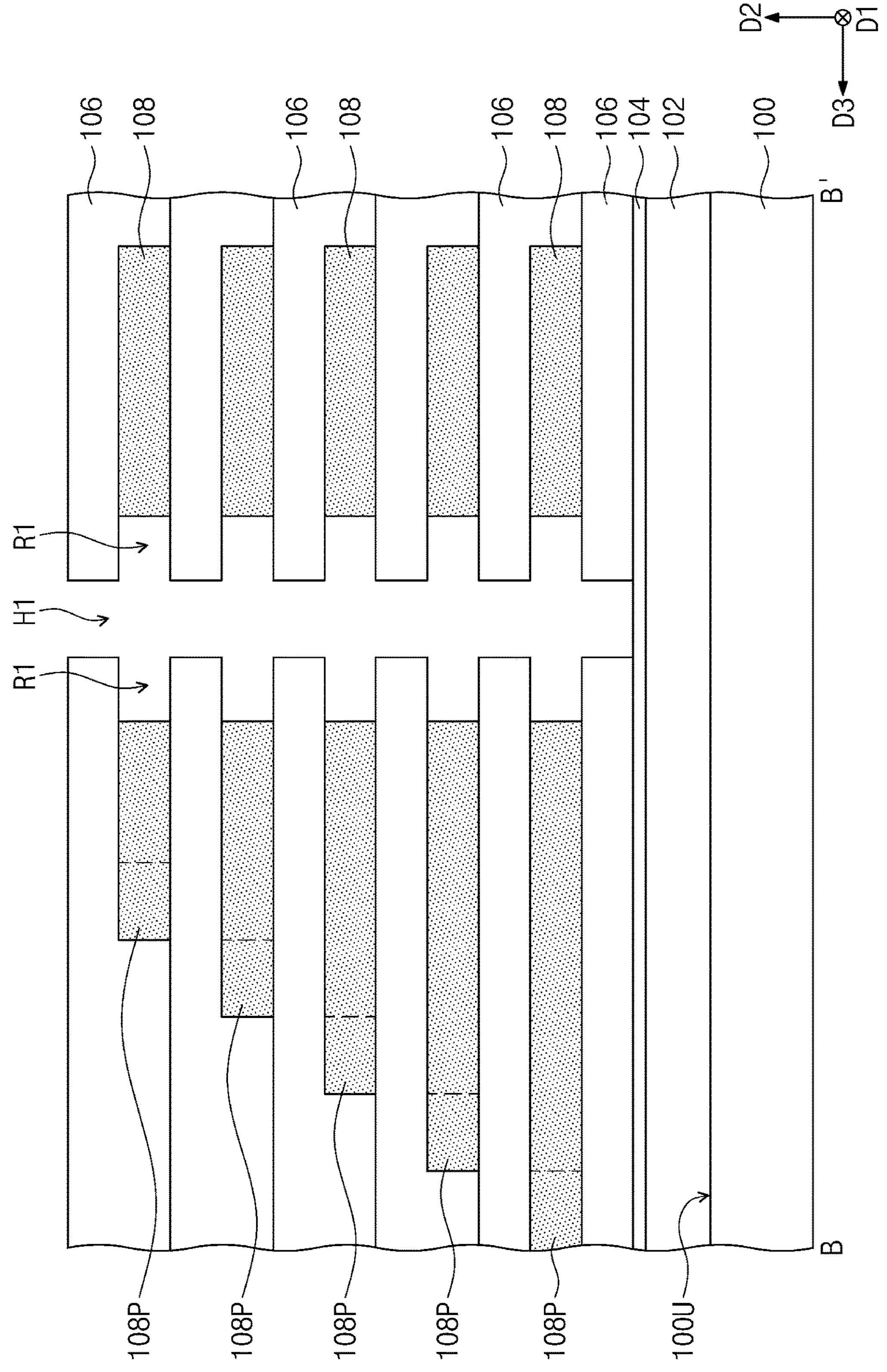

Referring to FIGS. 6, 7A, and 7B, first sacrificial patterns 110 may be respectively formed in the first trenches T1. The first sacrificial patterns 110 may be formed to respectively fill the first trenches T1. The first sacrificial patterns 110 may be spaced apart from each other in the first direction D1 with the first and second mold structures MS1 and MS2 interposed therebetween, and extend in the third direction D3. The first sacrificial patterns 110 may cover or be on both sides of each of the first and second mold structures MS1 and MS2. The first sacrificial patterns 110 may include a material having etch selectivity with respect to the sacrificial layers 108. For example, each of the first sacrificial patterns 110 may include silicon oxide conformally covering or overlapping inner surfaces of each of the first trenches T1 and filling upper regions of each of the first trenches T1 and silicon nitride filling the remainder of each of the first trenches T1.

Each of the first holes H1 may expose side surfaces of the interlayer insulating layers 106 and the sacrificial layers 108 of each of the first and second mold structures MS1 and MS2. The exposed side surfaces of the sacrificial layers 108 may be selectively recessed, and accordingly, first recess regions R1 may be formed in the first and second mold structures MS1 and MS2. Forming the first recess regions R1 may include, for example, performing an etching process having etch selectivity on the sacrificial layers 108 to etch the exposed side surfaces of the sacrificial layers 108, laterally. The first recess regions R1 may be spaced apart from each other in the second direction D2 within each of the first and second mold structures MS1 and MS2, and may be interposed between the interlayer insulating layers 106, respectively. Each of the first recess regions R1 may be formed to surround each of the first holes H1 on a plane view.

Figure 8:
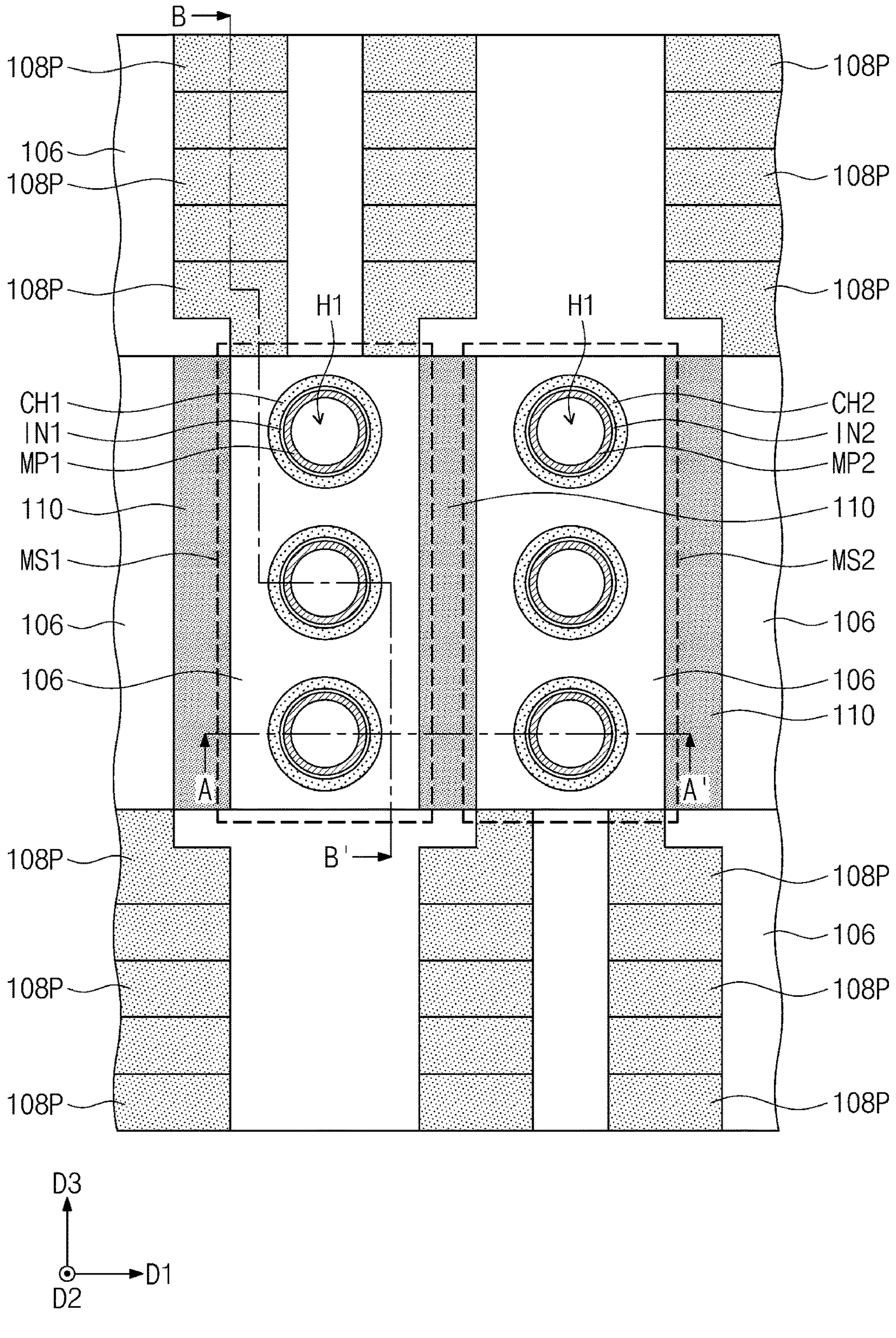
Figure 9A:
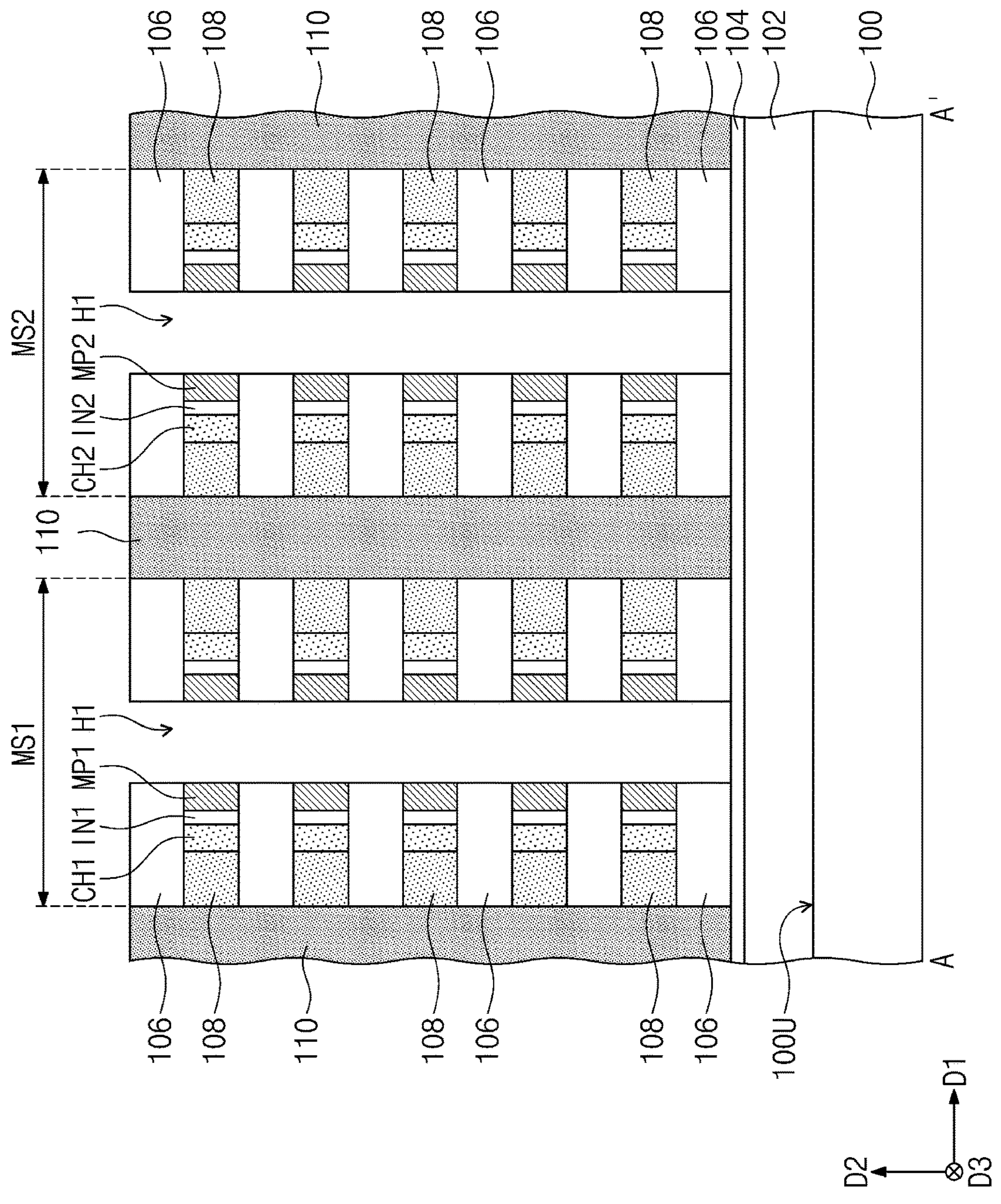
Figure 9B:
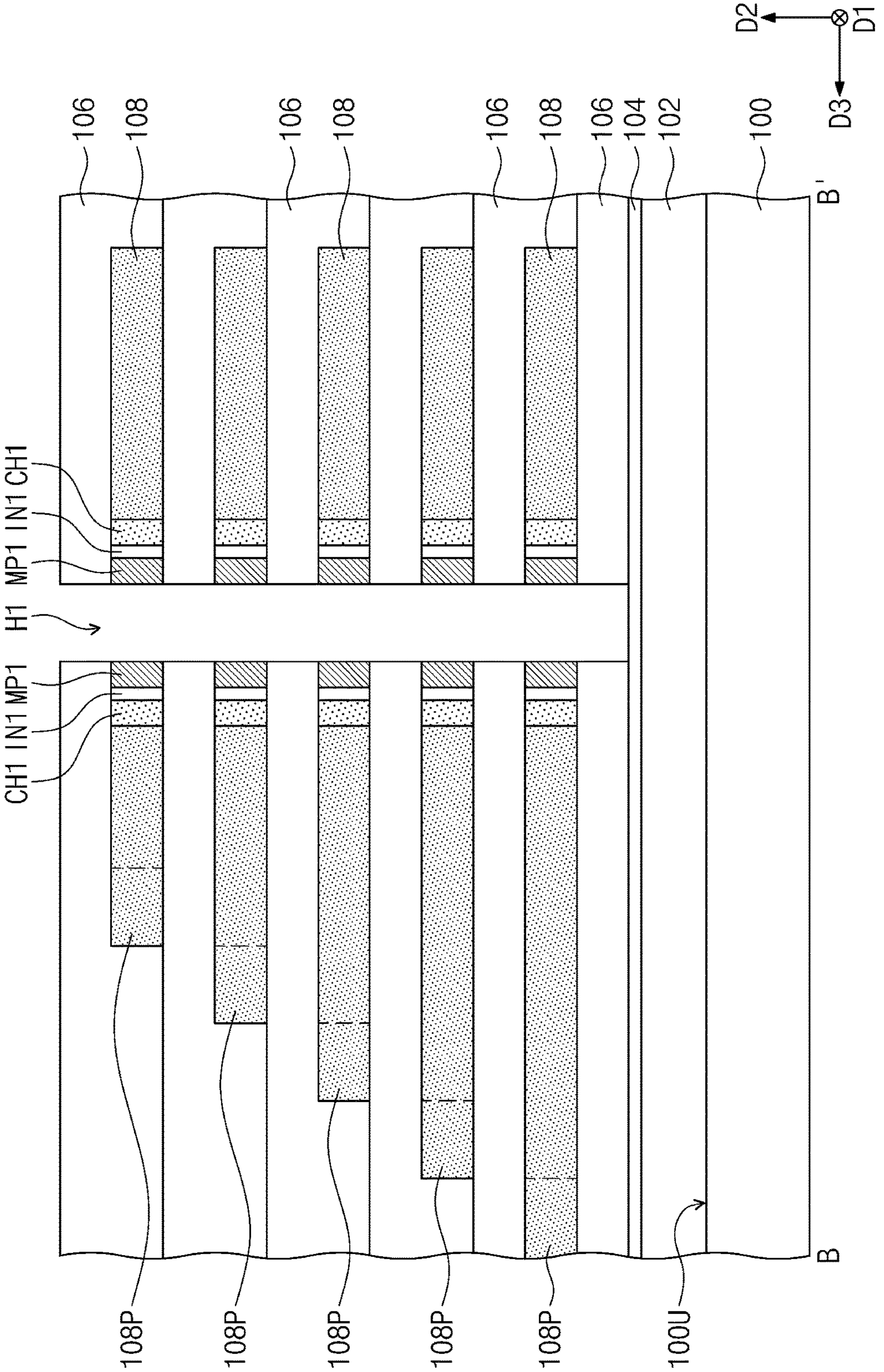

Referring to FIGS. 8, 9A and 9B, a plurality of first channel patterns CH1 may be respectively formed in the first recess regions R1 in the first mold structure MS1, respectively, and a plurality of second channel patterns CH2 may be formed in the first recess regions R1 of the second mold structure MS2, respectively. Each of the plurality of first and second channel patterns CH1 and CH2 may fill a portion of each of the first recess regions R1. Forming the plurality of first and second channel patterns CH1 and CH2 may include, for example, forming a channel layer filling the first recess regions R1 and at least partially filling each of the first holes H1, removing the channel layer from the first holes H1, and laterally etching the channel layer in each of the first recess regions R1 until the channel layer remains at a desired thickness.

First insulating patterns IN1 may be formed in the first recess regions R1 of the first mold structure MS1, respectively, and may cover or be on side surfaces of the plurality of first channel patterns CH1, respectively. Second insulating patterns IN2 may be formed in the first recess regions R1 of the second mold structure MS2, respectively, and may cover or be on side surfaces of the plurality of second channel patterns CH2, respectively. Each of the first and second insulating patterns IN1 and IN2 may fill a portion of each of the first recess regions R1. First metal patterns MP1 may be formed in the first recess regions R1 of the first mold structure MS1, respectively, and may cover or be on side surfaces of the first insulating patterns IN1, respectively. Second metal patterns MP2 may be formed in the first recess regions R1 of the second mold structure MS2, respectively, and may cover or be on side surfaces of the second insulating patterns IN2, respectively. Each of the first and second metal patterns MP1 and MP2 may fill the remainder of each of the first recess regions R1. The first and second insulating patterns IN1 and IN2 and the first and second metal patterns MP1 and MP2 may be formed by substantially the same manner as the plurality of first and second channel patterns CH1 and CH2.

Figure 10:
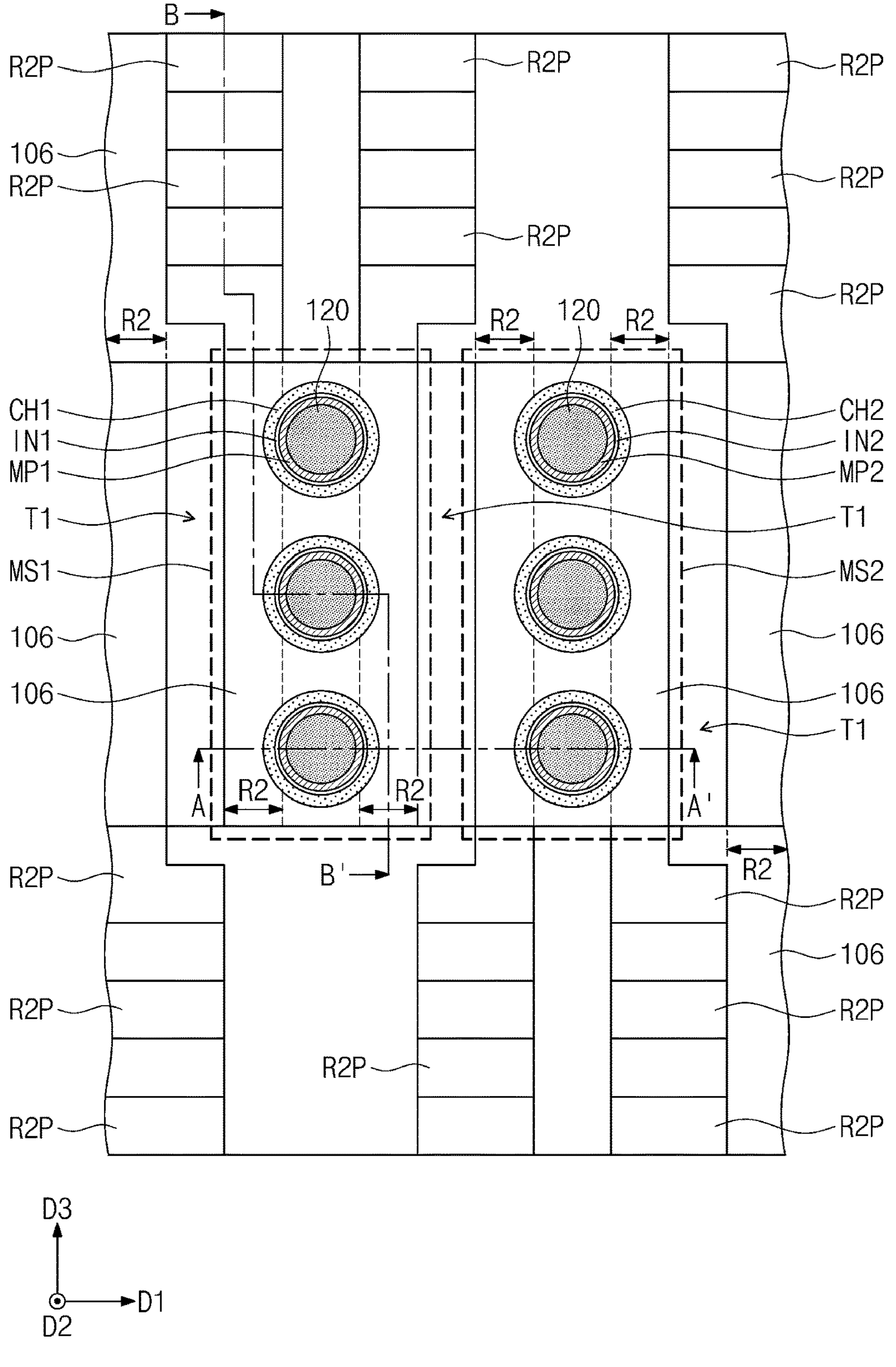
Figure 11A:
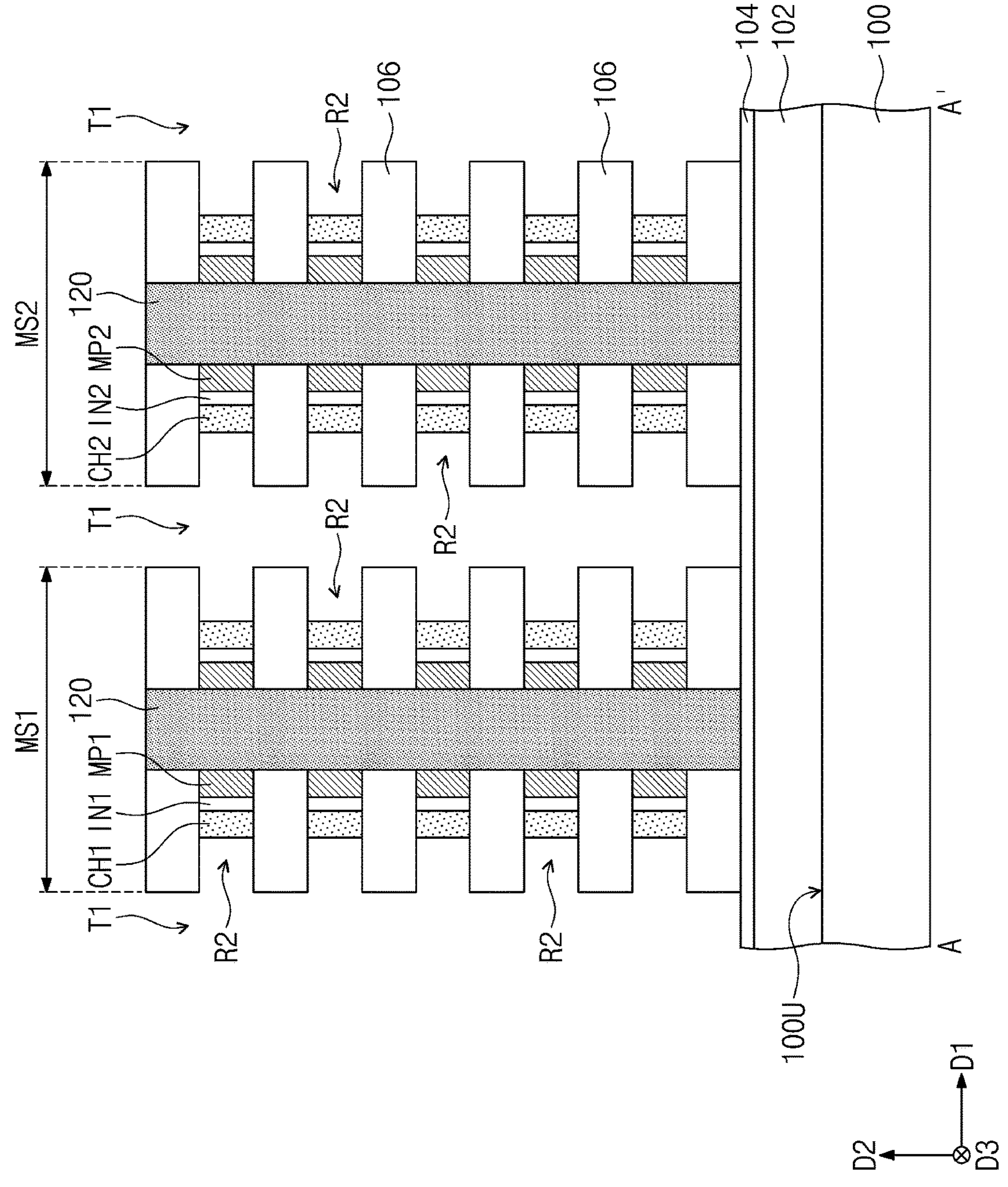
Figure 11B:
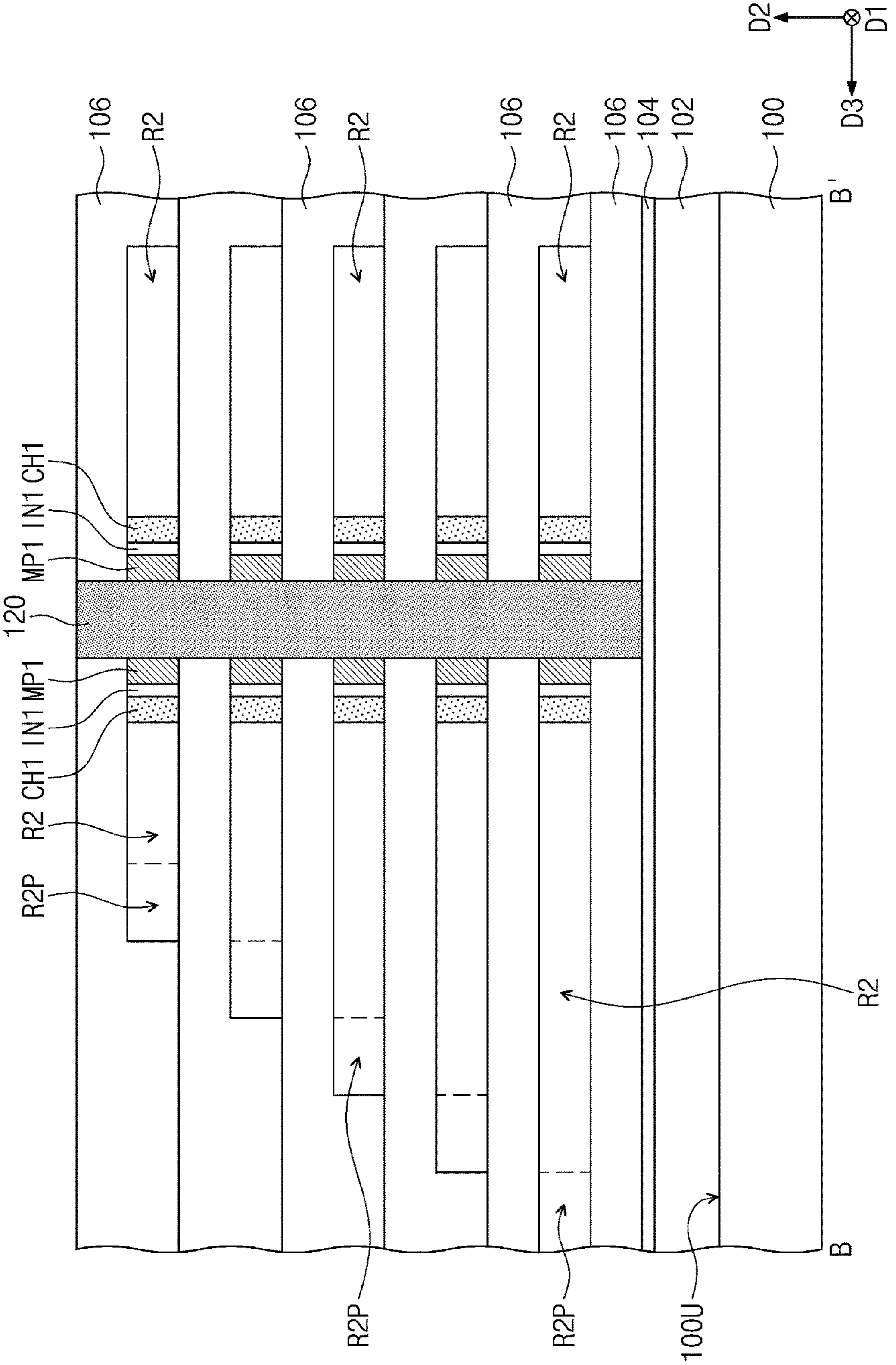

Referring to FIGS. 10, 11A and 11B, second sacrificial patterns 120 may be respectively formed in the first holes H1. The second sacrificial patterns 120 may be formed to fill the first holes H1, respectively. The second sacrificial patterns 120 may be spaced apart from each other in the third direction D3 in each of the first and second mold structures MS1 and MS2. The second sacrificial patterns 120 may include a material having etch selectivity with respect to the sacrificial layers 108. For example, each of the second sacrificial patterns 120 may include silicon oxide conformally covering or overlapping the inner surface of each of the first holes H1 and filling the upper region of each of the first holes H1, and silicon nitride filling the remainder of each of the first holes H1.

The first sacrificial patterns 110 may be removed from the first trenches T1. Each of the first trenches T1 may expose side surfaces of the interlayer insulating layers 106 and the sacrificial layers 108 of each of the first and second mold structures MS1 and MS2. The exposed side surfaces of the sacrificial layers 108 may be selectively recessed, and thus second recess regions R2 may be formed in the first and second mold structures MS1 and MS2. Forming the second recess regions R2 may include, for example, performing an etching process having etch selectivity on the sacrificial layers 108 to laterally etch the exposed side surfaces of the sacrificial layers 108. The second recess regions R2 may expose side surfaces of the plurality of first and second channel patterns CH1 and CH2. The second recess regions R2 may be spaced apart from each other in the second direction D2 within each of the first and second mold structures MS1 and MS2, and may be interposed between the interlayer insulating layers 106, respectively. Each of the second recess regions R2 may have a line shape extending in the third direction D3.

The sacrificial pads 108P may be removed while the sacrificial layers 108 in the first and second mold structures MS1 and MS2 are recessed, and accordingly, extended recess regions R2P may be formed. The second recessed regions R2 may be respectively connected to the extended recessed regions R2P. The second recessed regions R2 may include the extended recessed regions R2P, respectively.

Figure 12:
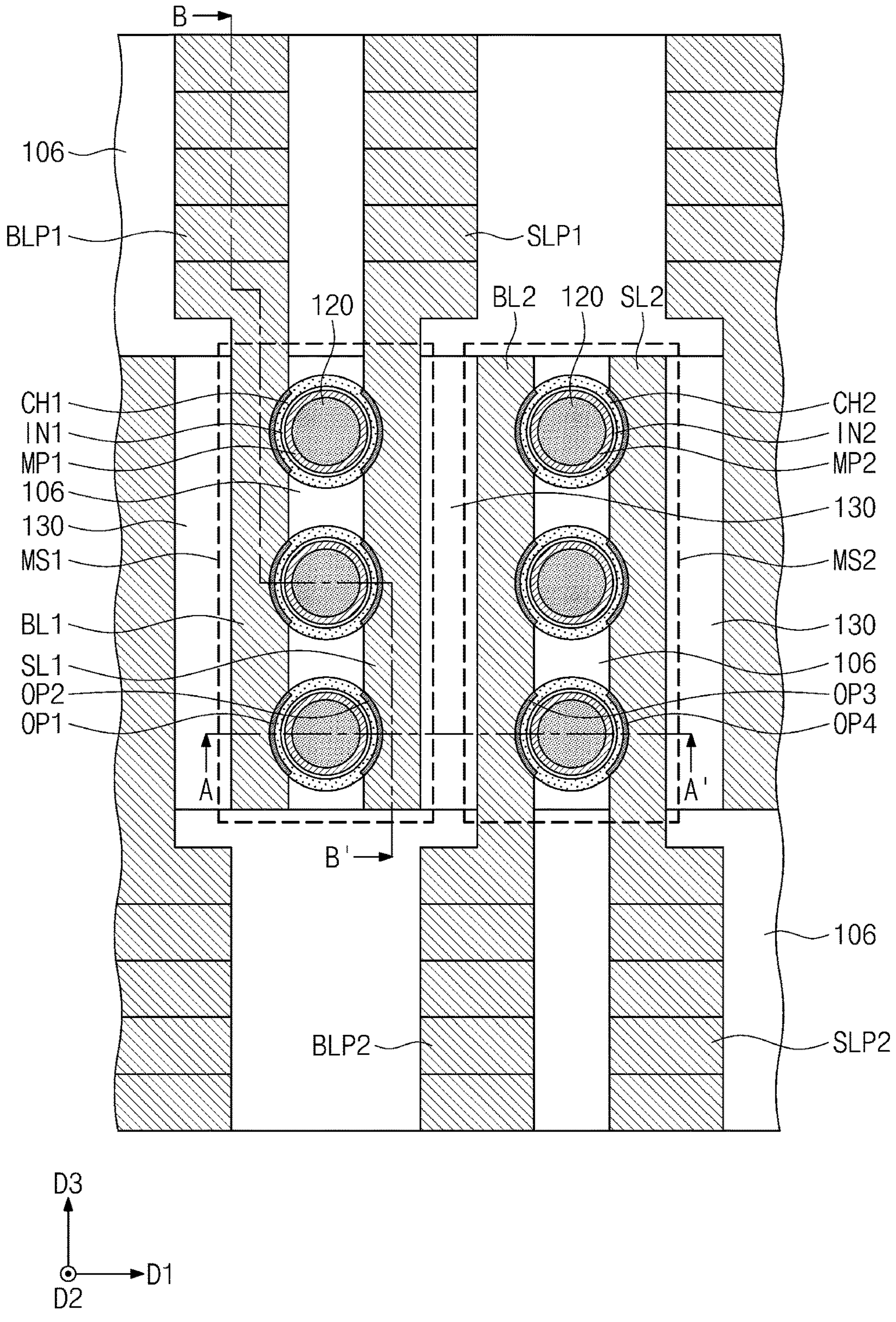
Figure 13A:
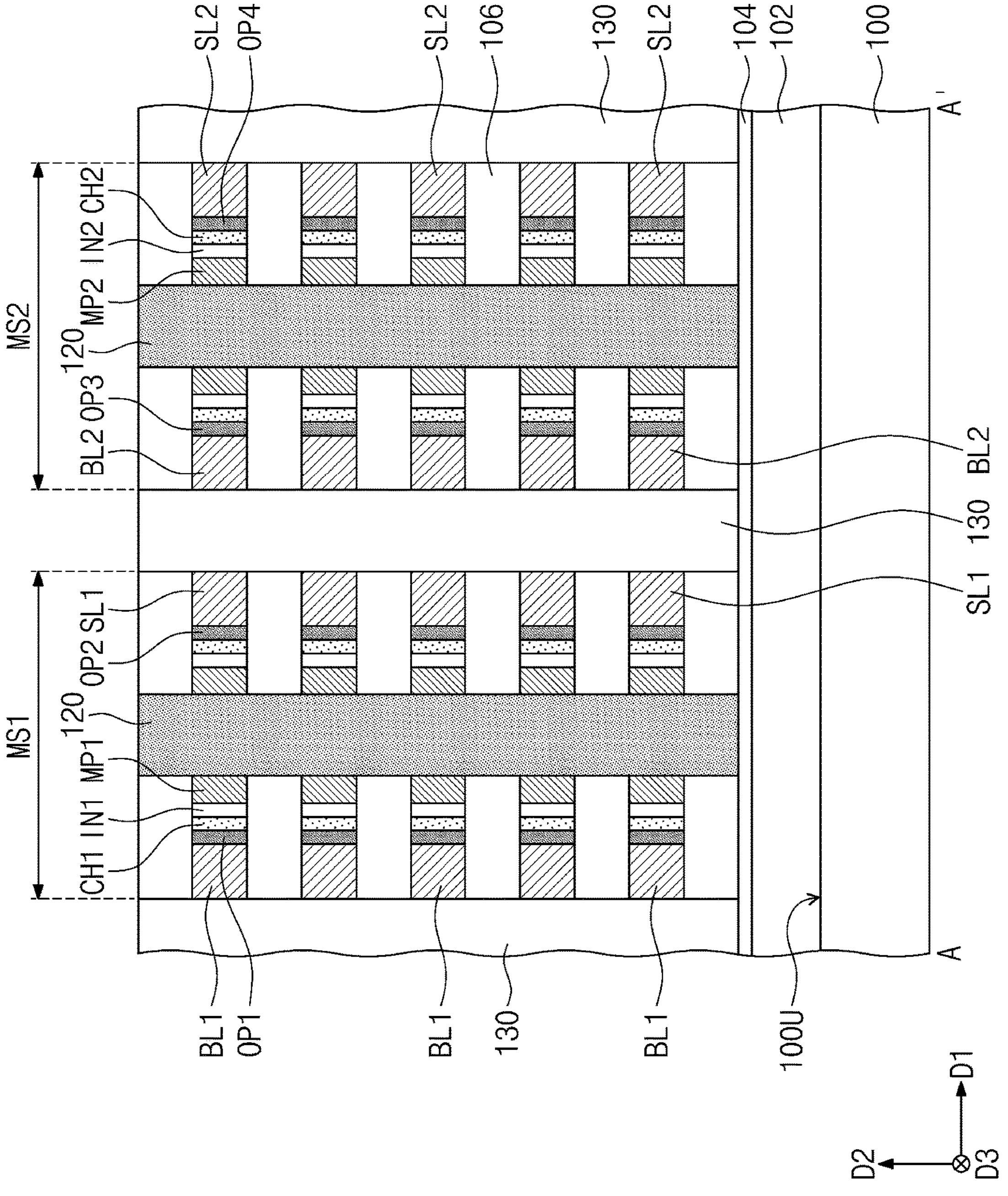
Figure 13B:
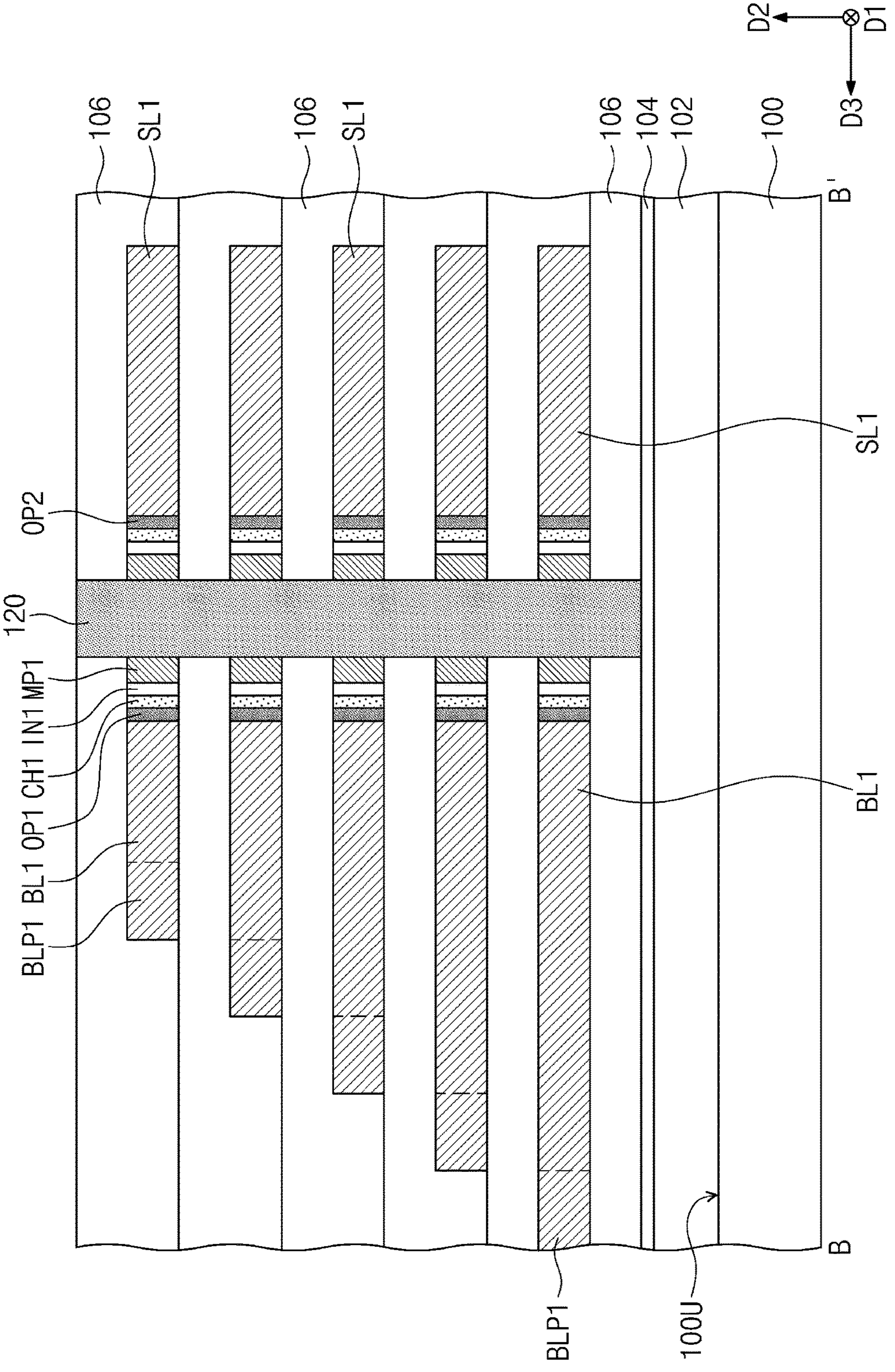

Referring to FIGS. 12, 13A, and 13B, first impurity patterns OP1 and second impurity patterns OP2 may be formed in the second recess regions R2 in the first mold structure MS1, respectively. Each of the first impurity patterns OP1 and the second impurity patterns OP2 may fill a portion of each of the second recess regions R2 in the first mold structure MS1, and may be in contact with one side of each of the plurality of first channel patterns CH1. The first impurity patterns OP1 may be spaced apart from each other in the second direction D2. The second impurity patterns OP2 may be spaced apart from the first impurity patterns OP1 in the first direction D1 and may be spaced apart from each other in the second direction D2.

Third impurity patterns OP3 and fourth impurity patterns OP4 may be respectively formed in the second recess regions R2 in the second mold structure MS2. Each of the third impurity patterns OP3 and the fourth impurity patterns OP4 may fill a portion of each of the second recess regions R2 in the second mold structure MS2, and may be in contact with one side of each of the plurality of second channel patterns CH2. The third impurity patterns OP3 may be spaced apart from each other in the second direction D2. The fourth impurity patterns OP4 may be spaced apart from the third impurity patterns OP3 in the first direction D1 and may be spaced apart from each other in the second direction D2.

Forming the first to fourth impurity patterns OP1, OP2, OP3, and OP4 may include, for example, doping impurities on side surfaces of the plurality of first and second channel patterns CH1 and CH2 exposed by the second recess regions R2. The first impurity patterns OP1 and the second impurity patterns OP2 may have the same conductivity type, and the third impurity patterns OP3 and the fourth impurity patterns OP4 may have the same conductivity type. The impurity may be an N-type impurity or a P-type impurity.

First bit lines BL1 and first source lines SL1 may be formed to fill the remaining portions of the second recess regions R2 in the first mold structure MS1. The first bit lines BL1 may be spaced apart from each other in the second direction D2, and may be respectively connected to the first impurity patterns OP1. The first source lines SL1 may be spaced apart from the first bit lines BL1 in the first direction D1 and may be spaced apart from each other in the second direction D2. The first source lines SL1 may be respectively connected to the second impurity patterns OP2. Each of the first bit lines BL1 and the first source lines SL1 may have a line shape extending in the third direction D3. First bit line pads BLP1 and first source line pads SLP1 may be respectively formed in corresponding extended recess regions R2P among the extended recess regions R2P. The first bit line pads BLP1 may be respectively connected to the first bit lines BL1, and the first source line pads SLP1 may be respectively connected to the first source lines SL1. The first bit line pads BLP1 may form a stepped structure at one side of the first mold structure MS1, and the first source line pads SLP1 may form a stepped structure at the one side of the first mold structure MS1.

Second bit lines BL2 and second source lines SL2 may be formed to fill the remaining portions of the second recess regions R2 in the second mold structure MS2. The second bit lines BL2 may be spaced apart from the first source lines SL1 in the first direction D1 and may be spaced apart from each other in the second direction D2. The second bit lines BL2 may be respectively connected to the third impurity patterns OP3. The second source lines SL2 may be spaced apart from the second bit lines BL2 in the first direction D1 and may be spaced apart from each other in the second direction D2. The second source lines SL2 may be respectively connected to the fourth impurity patterns OP4. Each of the second bit lines BL2 and the second source lines SL2 may have a line shape extending in the third direction D3. Second bit line pads BLP2 and second source line pads SLP2 may be respectively formed in corresponding extended recess regions R2P among the extended recess regions R2P. The second bit line pads BLP2 may be respectively connected to the second bit lines BL2, and the second source line pads SLP2 may be respectively connected to the second source lines SL2. The second bit line pads BLP2 may form a stepped structure at one side of the second mold structure MS2, and the second source line pads SLP2 may form a stepped structure at the one side of the second mold structure MS2.

The first bit line pads BLP1 and the first source line pads SLP1 may be spaced apart from the second bit line pads BLP2 and the second source line pads SLP2 in the third direction D3 with the first and second mold structures MS1 and MS2 interposed therebetween.

Forming the first and second bit lines BL1 and BL2, the first and second source lines SL1 and SL2, the first and second bit line pads BLP1 and BLP2, and the first and second bit line pads BLP1 and BLP2, and second source line pads SLP1 and SLP2 may include, for example, forming a conductive layer filling the remaining portions of the second recess regions R2 and the extended recess regions R2P and partially filling each of the first trenches T1, and removing the conductive layer from the first trenches T1.

Sidewall insulating patterns 130 may be respectively formed in the first trenches T1. The sidewall insulating patterns 130 may be formed to fill each of the first trenches T1. The sidewall insulating patterns 130 may be spaced apart from each other in the first direction D1 with the first and second mold structures MS1 and MS2 interposed therebetween. One of the sidewall insulating patterns 130 may extend in the second direction D2 to cover or be on side surfaces of the first bit lines BL1, and another one of the sidewall insulating patterns 130 may extend in the second direction D2 to cover or be on side surfaces of the first source lines SL1 and the second bit lines BL2. Another one of the sidewall insulating patterns 130 may extend in the second direction D2 to cover or be on side surfaces of the second source lines SL2. Each of the sidewall insulating patterns 130 may have a line shape extending in the third direction D3.

Figure 14:
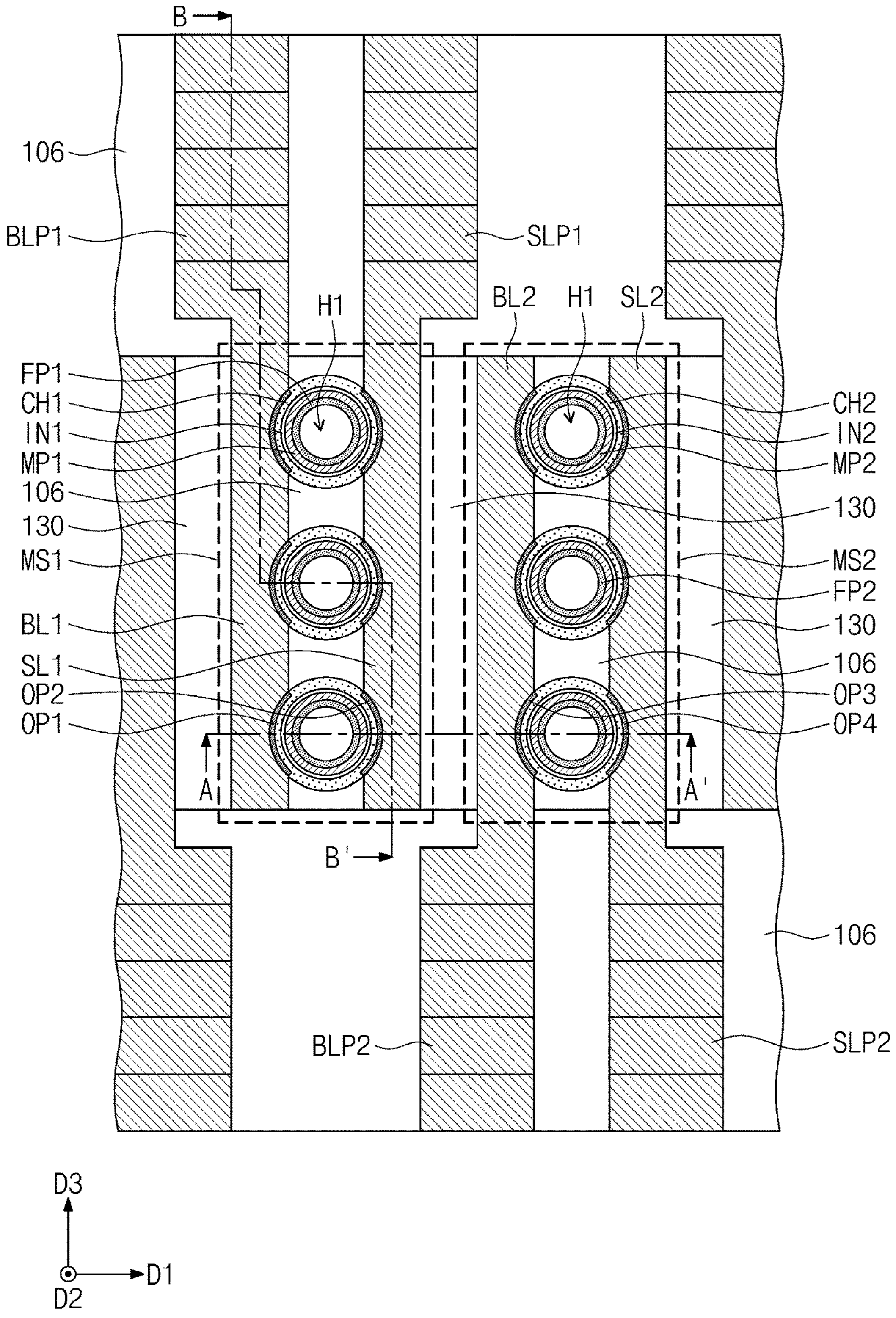
Figure 15A:
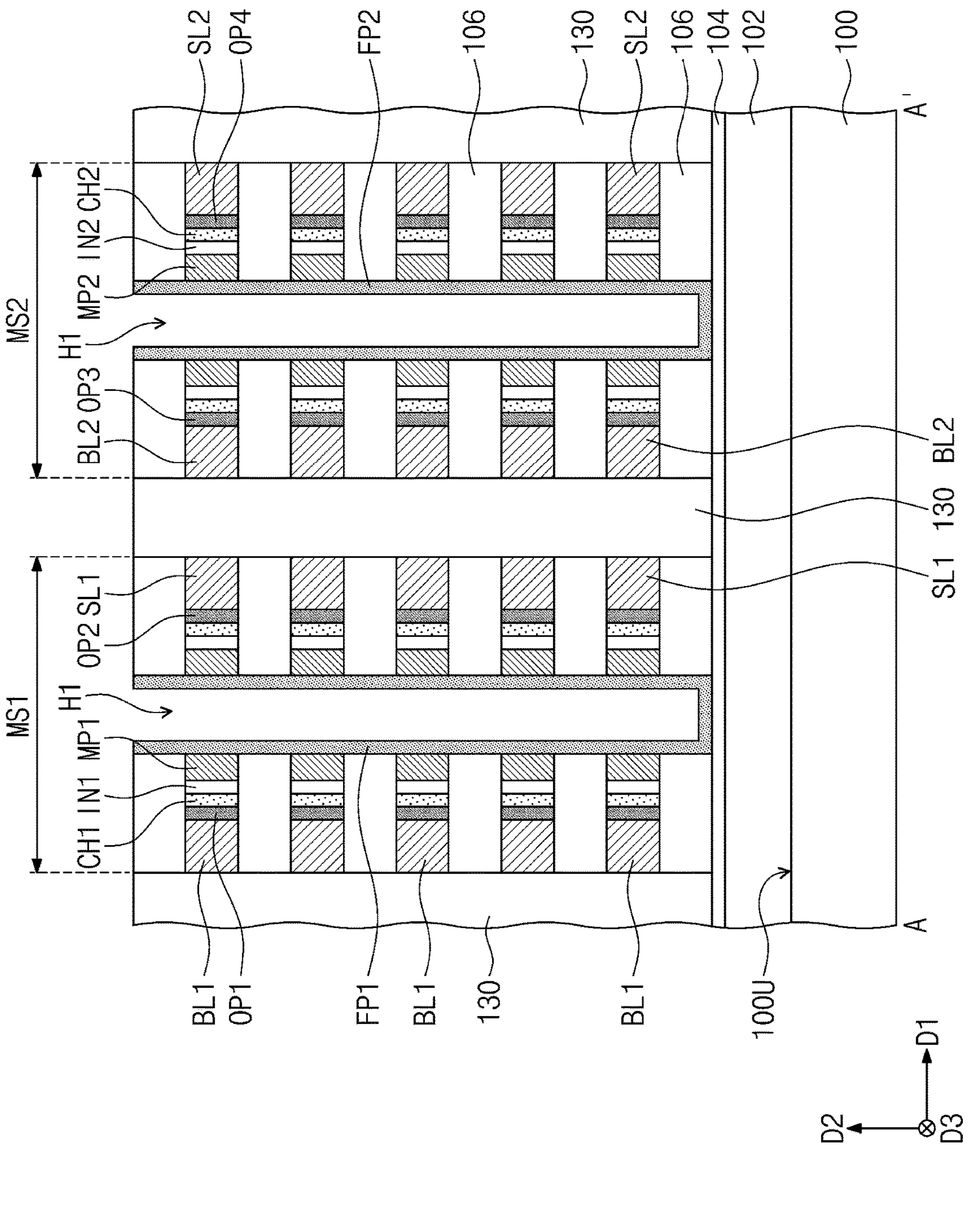
Figure 15B:
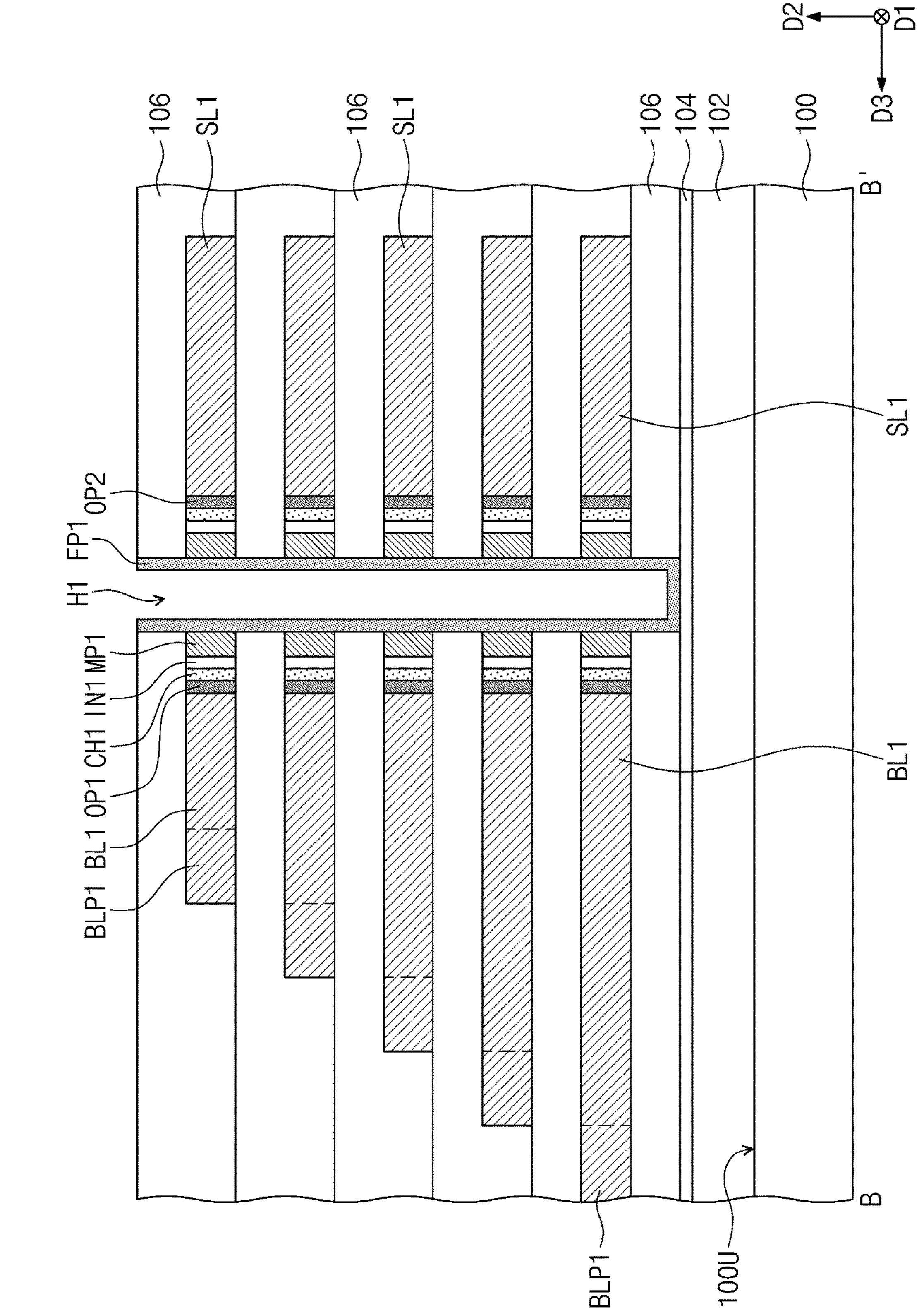

Referring to FIGS. 14, 15A and 15B, the second sacrificial patterns 120 may be removed from the first holes H1. A first ferroelectric pattern FP1 may be formed in each of the first holes H1 in the first mold structure MS1, and a second ferroelectric pattern FP2 may be formed in each of the first holes H1 in the second mold structure MS2. The first ferroelectric pattern FP1 may conformally cover, overlap, or be on inner surfaces of each of the first holes H1 in the first mold structure MS1. The first ferroelectric pattern FP1 may conformally cover or be on side surfaces of the first metal patterns MP1, side surfaces of the interlayer insulating layers 106, and an upper surface of the etch stop layer 104. The second ferroelectric pattern FP2 may conformally cover, overlap, or be on inner surfaces of each of the first holes H1 in the second mold structure MS2. The second ferroelectric pattern FP2 may conformally cover or be on side surfaces of the second metal patterns MP2, side surfaces of the interlayer insulating layers 106, and an upper surface of the etch stop layer 104.

Referring back to FIGS. 2, 3A and 3B, a first gate electrode GE1 may be formed in each of the first holes H1 in the first mold structure MS1, and a second gate electrode GE2 may be formed in each of the first holes H1 in the second mold structure MS2. The first gate electrode GE1, the first ferroelectric pattern FP1, the plurality of first channel patterns CH1, the first insulating patterns IN1, the first metal patterns MP1, the first and second impurity patterns OP1 and OP2, the first bit lines BL1, and the first source lines SL1 may be a first cell array CAR1. The second gate electrode GE2, the second ferroelectric pattern FP2, the plurality of second channel patterns CH2, the second insulating patterns IN2, the second metal patterns MP2, the third and fourth impurity patterns OP3 and OP4, the second bit lines BL2, and the second source lines SL2 may be a second cell array CAR2.

The first bit line pads BLP1 may be disposed on one side of the first cell array CAR1 and may be respectively connected to the first bit lines BL1. The first bit line pads BLP1 may be stacked in the second direction D2 on the one side of the first cell array CAR1 to form a stepped structure. The first source line pads SLP1 may be disposed on the one side of the first cell array CAR1 and may be respectively connected to the first source lines SL1. The first source line pads SLP1 may be stacked in the second direction D2 on the one side of the first cell array CAR1 to form a stepped structure. The first bit line pads BLP1 and the first source line pads SLP1 may be disposed on the same side of the first cell array CAR1, and may neighbor or be adjacent to each other in the first direction D1.

The second bit line pads BLP2 may be disposed on one side of the second cell array CAR2 and may be respectively connected to the second bit lines BL2. The second bit line pads BLP2 may be stacked in the second direction D2 on the one side of the second cell array CAR2 to form a stepped structure. The second source line pads SLP2 may be disposed on the one side of the second cell array CAR2 and may be respectively connected to the second source lines SL2. The second source line pads SLP2 may be stacked in the second direction D2 on the one side of the second cell array CAR2 to form a stepped structure. The second bit line pads BLP2 and the second source line pads SLP2 may be disposed on the same side of the second cell array CAR2 and may neighbor or be adjacent to each other in the first direction D1.

The first bit line pads BLP1 and the first source line pads SLP1 may be spaced apart from the second bit line pads BLP2 and the second source line pads SLP2 in the third direction D3 with the first cell array CAR1 and the second cell array CAR2 interposed therebetween.

Figure 16:
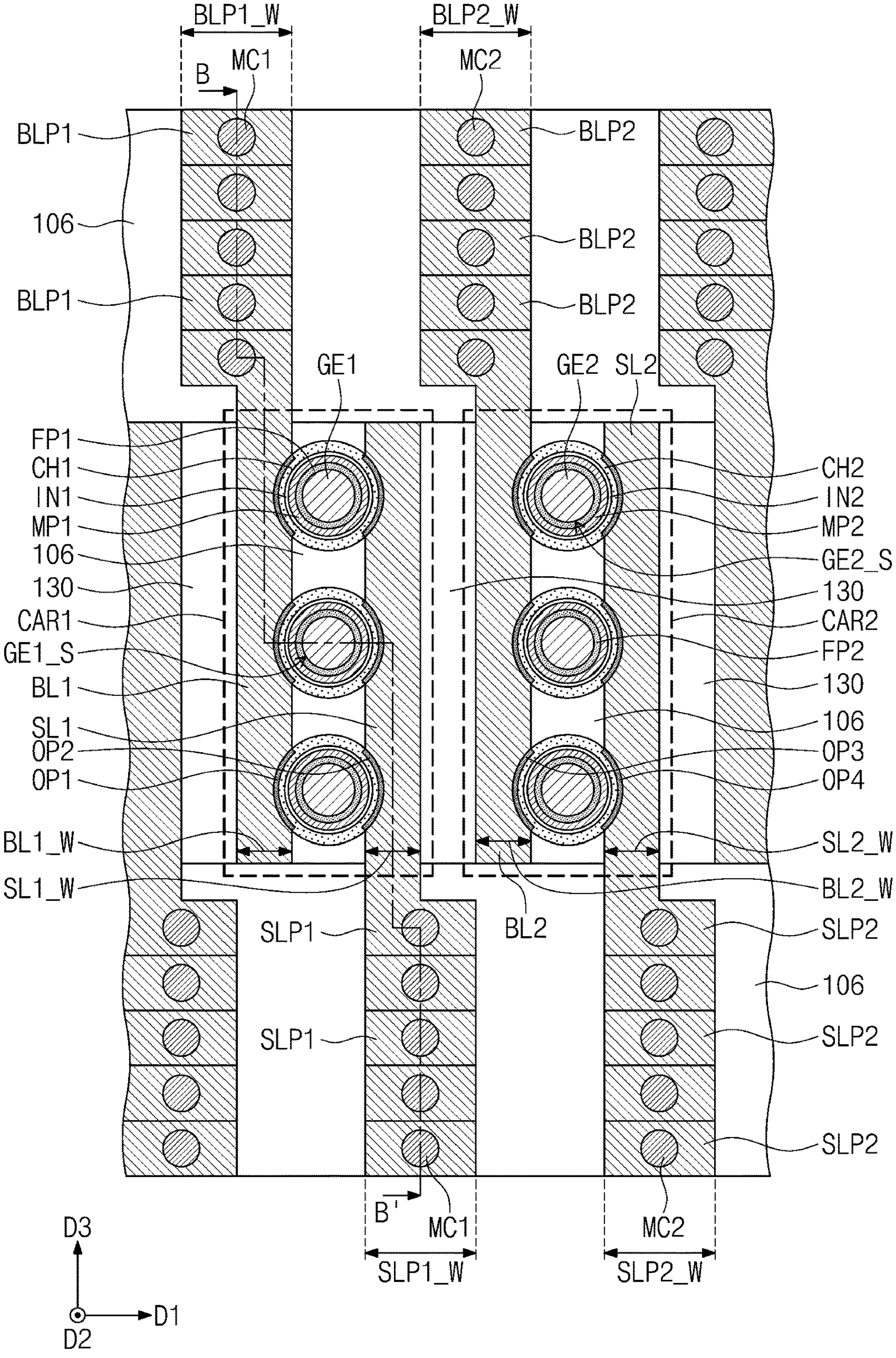
FIG. 16 is a plan view of a semiconductor device according to some embodiments of the inventive concept.
Figure 17:
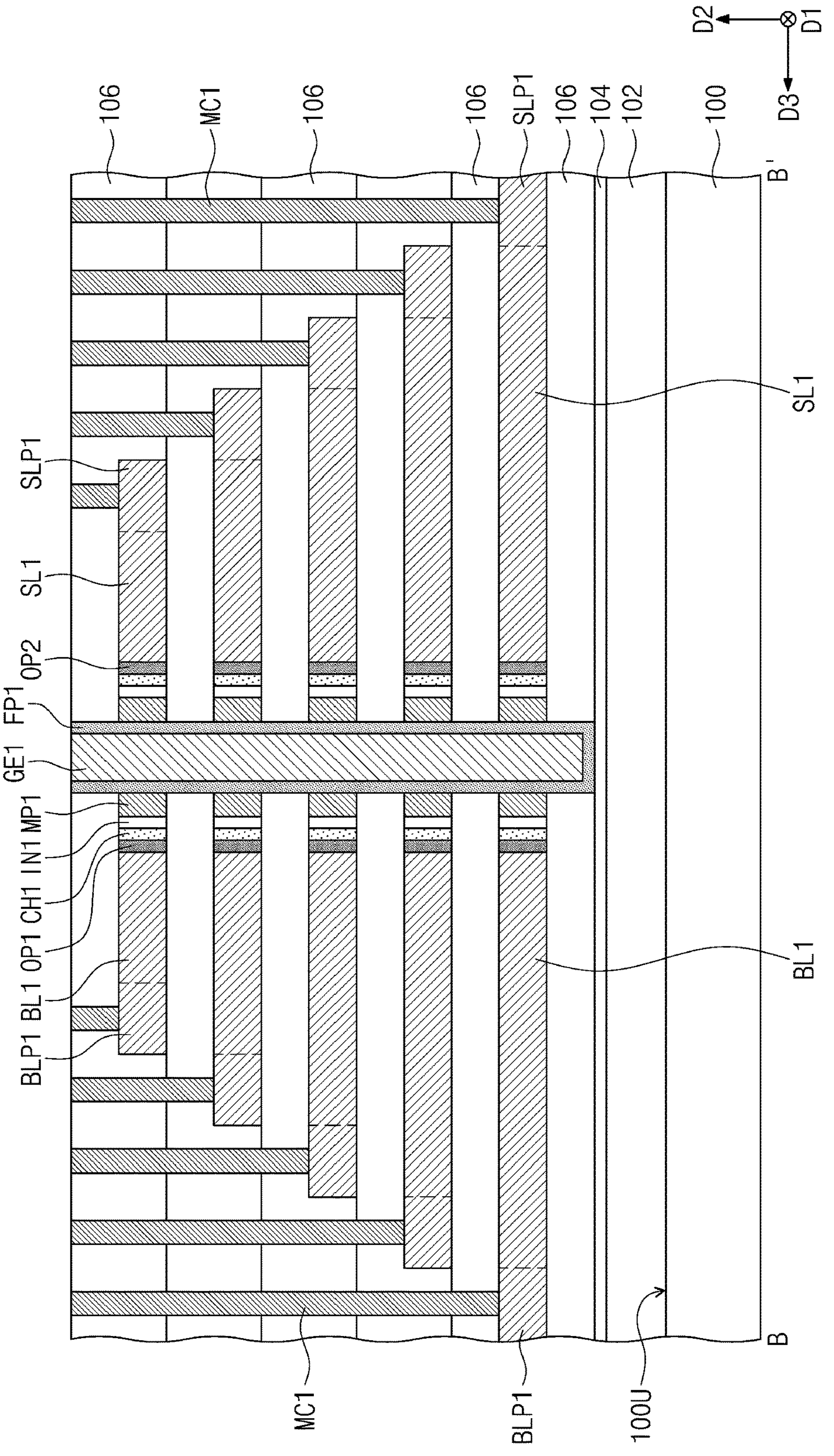
FIG. 17 is a cross-sectional view taken along line B-B' of FIG. 16.

FIG. 16 is a plan view of a semiconductor device according to some embodiments of the inventive concept, and FIG. 17 is a cross-sectional view taken along line B-B' of FIG. 16.

The cross-sectional view taken along line A-A' of FIG. 16 is substantially the same as the cross-sectional view of FIG. 3A. For simplicity of description, differences from the semiconductor device described with reference to FIGS. 1, 2, 3A, and 3B will be mainly described.

Referring to FIGS. 16, 3A, and 17, first bit line pads BLP1 may be disposed on one side of the first cell array CAR1 and may be connected to the first bit lines BL1, respectively. The first bit lines BL1 may extend longer in the third direction D3 as the first bit lines BL1 are closer to the substrate 100, and the first bit line pads BLP1 may be connected to ends of the first bit lines BL1, respectively. The first bit line pads BLP1 may be stacked in the second direction D2 on the one side of the first cell array CAR1 to form a stepped structure. A width BLP1_W of each of the first bit line pads BLP1 in the first direction D1 may be greater than a width BL1_W of each of the first bit lines BL1 in the first direction D1.

First source line pads SLP1 may be disposed on the other side of the first cell array CAR1 and may be respectively connected to the first source lines SL1. The first source lines SL1 may extend longer in a direction opposite to the third direction D3 as the first source lines SL1 are closer to the substrate 100, and the first source line pads SLP1 may be connected to ends of the first source lines SL1, respectively. The first source line pads SLP1 may be stacked on the other side of the first cell array CAR1 in the second direction D2 to form a stepped structure. A width SLP1_W of each of the first source line pads SLP1 in the first direction D1 may be greater than a width SL1_W of each of the first source lines SL1 in the first direction D1.

According to the present example embodiments, the first bit line pads BLP1 may be spaced apart from the first source line pads SLP1 in the third direction D3 with the first cell array CAR1 interposed therebetween. The first bit line pads BLP1 and the first source line pads SLP1 may be respectively disposed on opposite sides of the first cell array CAR1. The first bit lines BL1 and the first source lines SL1 may be referred to as first conductive lines, and the first bit line pads BLP1 and the first source line pads SLP1 may be referred to as first conductive line pads.

Second bit line pads BLP2 may be disposed on one side of the second cell array CAR2 and may be respectively connected to the second bit lines BL2. The second bit lines BL2 may extend longer in the third direction D3 as the second bit lines BL2 are closer to the substrate 100, and the second bit line pads BLP2 may be connected to ends of the second bit lines BL2, respectively. The second bit line pads BLP2 may be stacked in the second direction D2 on the one side of the second cell array CAR2 to form a stepped structure. A width BLP2_W of each of the second bit line pads BLP2 in the first direction D1 may be greater than a width BL2_W of each of the second bit lines BL2 in the first direction D1.

Second source line pads SLP2 may be disposed on the other side of the second cell array CAR2 and may be respectively connected to the second source lines SL2. The second source lines SL2 may extend longer in a direction opposite to the third direction D3 as the second source lines SL2 are closer to the substrate 100, and the second source line pads SLP2 may be connected to ends of the second source lines SL2, respectively. The second source line pads SLP2 may be stacked in the second direction D2 on the other side of the second cell array CAR2 to form a stepped structure. The width SLP2_W of each of the second source line pads SLP2 in the first direction D1 may be greater than a width SL2_W in the first direction D1.

According to the present example embodiments, the second bit line pads BLP2 may be spaced apart from the second source line pads SLP2 in the third direction D3 with the second cell array CAR2 interposed therebetween. The second bit line pads BLP2 and the second source line pads SLP2 may be respectively disposed on opposite sides of the second cell array CAR2. The second bit line pads BLP2 may neighbor or be adjacent to the first bit line pads BLP1 in the first direction D1, and the second source line pads SLP2 may neighbor or be adjacent to the first source line pads SLP1 in the first direction D1. The second bit lines BL2 and the second source lines SL2 may be referred to as second conductive lines, and the second bit line pads BLP2 and the second source line pads SLP2 may be referred to as second conductive line pads.

According to the present example embodiments, the first bit line pads BLP1 and the second bit line pads BLP2 may be spaced apart from the first source line pads SLP1 and the second source line pads SLP2 in the third direction D3 with the first cell array CAR1 and the second cell array CAR2 interposed therebetween. That is, the first bit line pads BLP1 and the second bit line pads BLP2 may be disposed in an opposite direction to the first source line pads SLP1 and the second source line pads SLP2. Accordingly, it may be easy to increase the widths BLP1_W, BLP2_W, SLP1_W, and SLP2_W of the first and second bit line pads BLP1 and BLP2 and the first and second source line pads SLP1 and SLP2, and as a result, the first conductive contacts MC1 may be easily formed on the first bit line pads BLP1 and the first source line pads SLP1, and the second conductive contacts MC2 may be easily formed on the second bit line pads BLP2 and the second source line pads SLP2. Accordingly, a semiconductor device that is easily highly integrated and has excellent reliability may be provided.

According to the concept of the inventive concept, the first bit line pads and the first source line pads connected to the first cell array may be disposed in opposite direction to the second bit line pads and the second source line pads connected to the second cell array. In some embodiments, the first bit line pads and the first source line pads connected to the first cell array may be disposed in opposite direction to each other. Accordingly, it may be easy to increase the widths of the first and second bit line pads and the first and second source line pads, and as a result, the conductive contacts may be easily formed on the first and second bit line pads and the first and second source line pads. Therefore, it is possible to provide the semiconductor device with the high integration and excellent reliability.

While embodiments are described above, a person skilled in the art may understand that many modifications and variations are made without departing from the spirit and scope of the inventive concept defined in the following claims. Accordingly, the example embodiments of the inventive concept should be considered in all respects as illustrative and not restrictive, with the spirit and scope of the inventive concept being indicated by the appended claims.

What is claimed is:

1. A semiconductor device comprising:

a first cell array and a second cell array on a substrate and adjacent to each other in a first direction parallel to an upper surface of the substrate;

the first cell array comprising:

a first gate electrode that extends in a second direction perpendicular to the upper surface of the substrate;

first channel patterns on a side surface of the first gate electrode and spaced apart from each other in the second direction; and a first bit line electrically connected to a corresponding first channel pattern among the first channel patterns, and the second cell array comprising:

a second gate electrode that extends in the second direction;

second channel patterns on a side surface of the second gate electrode and spaced apart from each other in the second direction; and a second bit line electrically connected to a corresponding second channel pattern among the second channel patterns;

a first bit line pad electrically connected to the first bit line; and a second bit line pad electrically connected to the second bit line, wherein the first bit line pad is offset from the second bit line pad in both the first direction and a third direction which is parallel to the upper surface of the substrate and intersects the first direction, with the first and second cell arrays therebetween, and wherein the first bit line pad and the first bit line form a first L-shape, the second bit line pad and the second bit line form a second L-shape, and the first L-shape and the second L-shape are symmetric about the first direction.

2. The semiconductor device of claim 1, wherein the first bit line and the second bit line are spaced apart from each other in the first direction and extend in the third direction.

3. The semiconductor device of claim 2, wherein a width of the first bit line pad in the first direction is greater than a width of the first bit line in the first direction.

4. The semiconductor device of claim 3, wherein a width of the second bit line pad in the first direction is greater than a width of the second bit line in the first direction.

5. The semiconductor device of claim 1, wherein the first cell array further comprises a first source line electrically connected to the corresponding first channel pattern, wherein the semiconductor device further comprises a first source line pad electrically connected to the first source line, and wherein the first source line pad is adjacent to the first bit line pad in the first direction.

6. The semiconductor device of claim 5, wherein the second cell array further comprises a second source line electrically connected to the corresponding second channel pattern, wherein the semiconductor device further comprises a second source line pad electrically connected to the second source line, and wherein the second source line pad is adjacent to the second bit line pad in the first direction.

7. The semiconductor device of claim 6, wherein the first bit line, the first source line, the second bit line, and the second source line are spaced apart from each other in the first direction and extend in the third direction.

8. The semiconductor device of claim 7, wherein a width of the first bit line pad in the first direction is greater than a width of the first bit line in the first direction, and wherein a width of the first source line pad in the first direction is greater than a width of the first source line in the first direction.

9. The semiconductor device of claim 8, wherein a width of the second bit line pad in the first direction is greater than a width of the second bit line in the first direction, and wherein a width of the second source line pad in the first direction is greater than a width of the second source line in the first direction.

10. The semiconductor device of claim 1, wherein the first cell array further comprises:

a first insulating pattern between each of the first channel patterns and the first gate electrode; and a first ferroelectric pattern between the first insulating pattern and the first gate electrode, and wherein the second cell array further comprises:

a second insulating pattern between each of the second channel patterns and the second gate electrode; and a second ferroelectric pattern between the second insulating pattern and the second gate electrode.

11. The semiconductor device of claim 1, further comprising:

a first conductive contact on the first bit line pad; and a second conductive contact on the second bit line pad.

12. A semiconductor device comprising:

a first cell array on a substrate, the first cell array comprising:

a first bit line and a first source line spaced apart from each other in a first direction parallel to an upper surface of the substrate;

a first gate electrode between the first bit line and the first source line, wherein the first gate electrode extends in a second direction perpendicular to the upper surface of the substrate; and first channel patterns on a side surface of the first gate electrode and spaced apart from each other in the second direction;

a first bit line pad electrically connected to the first bit line; and a first source line pad electrically connected to the first source line, wherein the first bit line and the first source line extend in a third direction parallel to the upper surface of the substrate and intersecting the first direction, wherein the first bit line pad is offset from the first source line pad in both the first direction and the third direction with the first cell array therebetween, and wherein the first bit line pad and the first bit line form a first L-shape, the first source line pad and the first source line form a second L-shape, and the first L-shape and the second L-shape are rotationally symmetric.

13. The semiconductor device of claim 12, wherein the first bit line and the first source line are electrically connected to a corresponding first channel pattern among the first channel patterns.

14. The semiconductor device of claim 12, wherein a width of the first bit line pad in the first direction is greater than a width of the first bit line in the first direction.

15. The semiconductor device of claim 14, wherein a width of the first source line pad in the first direction is greater than a width of the first source line in the first direction.

16. The semiconductor device of claim 12, wherein the first cell array further comprises:

a first insulating pattern between each of the first channel patterns and the first gate electrode; and a first ferroelectric pattern between the first insulating pattern and the first gate electrode.

17. The semiconductor device of claim 12, further comprising:

first conductive contacts respectively on the first bit line pad and the first source line pad, wherein the first conductive contacts are spaced apart from each other in the third direction with the first cell array therebetween.

18. A semiconductor device comprising:

a first cell array and a second cell array on a substrate and adjacent to each other in a first direction parallel to an upper surface of the substrate, the first cell array comprising:

a first gate electrode that extends in a second direction perpendicular to the upper surface of the substrate;

first channel patterns on a side surface of the first gate electrode and spaced apart from each other in the second direction; and first conductive lines respectively electrically connected to the first channel patterns and spaced apart from each other in the second direction, and the second cell array comprising:

a second gate electrode that extends in the second direction;

second channel patterns on a side surface of the second gate electrode and spaced apart from each other in the second direction; and second conductive lines respectively electrically connected to the second channel patterns and spaced apart from each other in the second direction;

first conductive line pads respectively electrically connected to the first conductive lines; and second conductive line pads respectively electrically connected to the second conductive lines, wherein the first conductive line pads are offset from the second conductive line pads in both the first direction and a third direction which is parallel to the upper surface of the substrate and intersects the first direction, with the first and second cell arrays therebetween, and wherein the first conductive line pads and/or the second conductive line pads are stacked in the second direction in a stepped structure.

19. The semiconductor device of claim 18, wherein the first conductive line pads are stacked in the second direction in a first stepped structure.

20. The semiconductor device of claim 19, wherein the second conductive line pads are stacked in the second direction in a second stepped structure.

* * * * *